United States Patent
Miyake

(10) Patent No.: US 6,532,560 B1
(45) Date of Patent: Mar. 11, 2003

(54) INTERNAL CLOCK GENERATING CIRCUITRY HAVING TESTING FUNCTION

(75) Inventor: Takashi Miyake, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/553,382

(22) Filed: Apr. 20, 2000

(30) Foreign Application Priority Data

Dec. 1, 1999 (JP) ............................................ 11-342468

(51) Int. Cl.[7] .............................................. G01R 31/28
(52) U.S. Cl. ....................................... 714/731; 327/159
(58) Field of Search ....................... 714/731; 365/233.5, 365/200–201, 233, 149, 189.09, 191, 193, 194; 375/376; 331/1 A, 14, 18, 25, 34; 708/319, 300; 327/158

(56) References Cited

U.S. PATENT DOCUMENTS 5,193,070 A * 3/1993 Abiko et al. ................ 708/300
5,524,114 A * 6/1996 Peng .......................... 714/724

FOREIGN PATENT DOCUMENTS

JP 8-316833 11/1996 ............. H03L/7/10

* cited by examiner

*Primary Examiner*—Albert Decady
*Assistant Examiner*—Guy Lamarre
(74) *Attorney, Agent, or Firm*—Burns, Doane, Swecker & Mathis, LLP

(57) ABSTRACT

Internal clock generating circuitry comprises a phase comparator (1) for comparing the phase of a clock signal applied thereto from outside the circuitry with that of a feedback signal fed back thereto, and for generating a voltage corresponding to the difference between the phases of those clock signals, a voltage-controlled oscillator or VCO (2) for generating a clock signal having a frequency corresponding to the voltage from the phase comparator (1), a normal clock signal generating circuit (3) for generating at least one normal clock signal used for making an internal circuit operate under normal conditions from the clock signal from the VCO (2), and for generating and feeding the feedback signal back to the phase comparator (1), a test VCO (5) for generating a clock signal having a frequency corresponding to the voltage from the phase comparator (1), a test clock signal generating circuit (6) for generating at least one test clock signal used for testing the internal circuit from the clock signal from the test VCO (5), a selector (4) for selecting either the normal clock signal or the test clock signal generated, and for furnishing the selected clock signal to the internal circuit, and a control signal generating circuit (7) for generating a control signal to stop the test VCO (5) according to an input signal applied thereto from outside the circuitry.

6 Claims, 20 Drawing Sheets

INTERNAL CLOCK GENERATING CIRCUITRY HAVING TESTING FUNCTION

BACKGROUND OF THE INVENTION

1. Field of the Invention

The present invention relates to internal clock generating circuitry provided with a phase locked loop or PLL built therein for testing an integrated circuit that can operate with a high-speed clock, for supplying an internal clock to the integrated circuit.

2. Description of the Prior Art

Referring next to FIG. 17, a schematic circuit diagram is illustrated showing the structure of prior art internal clock generating circuitry having a PLL built therein and a testing function. In the figure, reference numeral 101 denotes a phase comparator for comparing the phases of two input voltages with each other and for generating a voltage VCNT corresponding to the phase difference, numeral 102 denotes a VCO for generating a clock signal having a frequency corresponding to the output voltage VCNT from the phase comparator 101, numeral 103 denotes a normal clock generating circuit for generating a plurality of normal clock signals from the clock signal, as an original signal applied thereto, from the VCO 102 and for furnishing a feedback signal to the phase comparator 101, numeral 104 denotes a selector for switching between the plurality of normal clock signals from the normal clock generating circuit 103 and a plurality of test clock signals described below, numeral 105 denotes a voltage controlled delay circuit for generating a clock signal while controlling a delay to be provided for the clock signal according to a control voltage applied thereto, numeral 106 denotes a test clock generating circuit for generating the plurality of test clock signals from the clock signal, as an original signal applied thereto, from the voltage controlled delay circuit 105, numeral 107 denotes an inverter, and numeral 108 denotes a tristate gate having an inverting function. The VCO 102 generates a clock signal whose frequency is adjusted according to the voltage VCNT from the phase comparator 101 so that the phase difference between the phases of the two input clock signals applied to the phase comparator 101 becomes small. In addition, reference strings Xin and Xout denote input terminals to which signals are applied from outside the internal clock generating circuitry, and reference character A denotes a control signal applied in common to both the selector 104 and the tristate gate 103.

Referring next to FIG. 18, a schematic circuit diagram is illustrated showing the transistor-level structure of the VCO 102. Each of a plurality of transistor groups 110a to 110e, each of which is surrounded by a dashed line in the figure, constitutes an inverter. Changing the control voltage VCNT can control a current flowing through each of the plurality of transistor groups that constitutes each of the plurality of inverters 110a to 110e, thus delaying the transmission of a signal between any two adjacent inverters. In FIG. 18, reference characters a, b, c, d, and e denote output signals from the plurality of inverters, respectively. FIG. 19 is a schematic circuit diagram showing the transistor-level structure of the voltage controlled delay circuit 105. As can be seen from the figure, the voltage controlled delay circuit 105 can be constructed by connecting two VCOs, as shown in FIG. 18, in each of which the loop is, however, opened, so that a plurality of inverters 111a to 111j are connected in series. Even in this circuit, changing the control voltage VCNT can control a current flowing through each of the plurality of transistor groups that constitutes each of the plurality of inverters 111a to 111j, thus delaying a clock signal applied to the input terminal Xin by a time delay corresponding to the control voltage while the clock signal travels between any two adjacent inverters.

Referring next to FIG. 20, an example is illustrated of the normal clock generating circuit that generates a plurality of normal clock signals based on the clock signal from the VCO. In the figure, reference numerals 120, 121, 122, and 123 denote path transistors, numerals 124, 125, 126, 127, 128, and 129 denote inverters, numeral 130 denotes a NAND gate, and numerals 131 and 132 denotes AND gates. In addition, reference characters b, c, and d denote the same signals as the output signals b, c, and d from the VCO as shown in FIG. 18. A circuit surrounded by a dashed line is a frequency divider for dividing the frequency of a clock signal applied thereto to generate a clock having a frequency one-half times as large as that of the input clock signal. Since the divider is a well known device in this field, the detailed description of the divider will be omitted hereinafter.

Under normal conditions, the control signal A at a given level is applied to both the tristate gate 108 and the selector 104 so that the tristate gate 108 is brought into conduction and the selector 104 selects the plurality of normal clocks 1 to 3 as a plurality of internal clocks 1 to 3, respectively. As a result, the clock signal applied to the input terminal Xin is furnished, by way of the other input terminal Xout, to the phase comparator 101. The phase comparator 101 compares the phase of the clock signal applied to the input terminal Xin with that of the clock signal fed back thereto from the normal clock generating circuit 103, and then generates and furnishes a voltage VCNT corresponding to the phase difference between those clock signals to the VCO 102. The VCO 102 oscillates according to the voltage VCNT to supply an original clock signal to the normal clock generating circuit 103 to allow the normal clock generating circuit to generate the plurality of normal clock signals. The normal clock generating circuit 103 divides the frequency of the input original clock signal to generate the plurality of normal clock signals, and then generates and feeds a clock signal whose frequency is one-quarter of that of the original clock signal back to the phase comparator 101. In this manner, the normal clock generating circuit 103 generates the plurality of normal clock signals 1 to 3 in cooperation with the phase comparator 101, and the VCO 102, which constitute a feedback loop together with the normal clock generating circuit 103. The selector 104 delivers the plurality of normal clock signals 1 to 3, as the internal clock signals 1 to 3.

Next, a description will be made as to the operation of each component of the internal clock generating circuitry under normal conditions. FIG. 21 is a timing chart showing the waveforms of a plurality of clock signals applied to the circuitry and generated in the circuitry under normal conditions. As shown in FIG. 18, the VCO 102 determines a oscillating frequency based on the delays which the plurality of inverters included with the VCO 102 provide according to the voltage VCNT from the phase comparator 101. The output signals b, c, d, and e from the respective stages of the VCO 102 are delayed with respect to the output signals a, b, c, and d by a given time delay, respectively. In addition, each of the output signals b, c, d, and e is the inverse of each of the output signals a, b, c, and d. When the output signals b, c, and d from the VCO 102 are applied to the signals lines b, c, and d as shown in FIG. 20, respectively, a signal ICLK3 is generated from the output signals b and d. Further, another signal ICLK1 is generated by dividing the output signal c and another signal ICLK2, which is the inverse of ICLK1, is generated. The VCO 102 then generates a normal clock signal 1 from ICLK1 and ICLK3, and generates a normal clock signal 2 from ICLK2 and ICLK3. In addition, when the frequency divider surrounded by a dashed line of FIG. 20 receives the normal clock signal 1 via the signal line c, it generates and furnishes a normal clock signal 3 as ICLK1.

Next, a description will be made as to the operation of the internal clock generating circuitry that is placed in test mode. FIGS. 22 and 23 are timing charts showing the waveforms of the plurality of clock signals applied to the circuitry and generated in the circuitry in test mode. In test mode, a high impedance is created between the input terminals Xin and Xout. The control signal A at a given level is applied to the selector 104 so that the selector 104 selects the plurality of test clock signals 1 to 3 as the plurality of internal clock signals 1 to 3. Under this condition, clock signals, as shown in FIG. 22, are applied to the input terminals Xin and Xout, respectively. The clock signal applied to the input terminal Xout is the same as the clock signal applied to the input terminal Xin under normal conditions. The same feedback control as that done under normal conditions is carried out to supply the voltage VCNT from the phase comparator to the voltage controlled delay circuit 105. In the voltage controlled delay circuit 105 to which the voltage VCNT is supplied, each group of transistors, which constitutes each of the plurality of inverters 111a to 111j, provides the same delay as provided by the VCO 102. Under this condition, when the circuitry receives a clock having the same frequency as the internal clock signal 1 by way of the input terminal Xin, the output signals b, c, d, e, a', b', c', d', and e' from the respective stages of the voltage controlled delay circuit 105 are delayed with respect to the output signals a, b, c, d, e, a', b', c', and d' by a given time delay, respectively, as shown in FIG. 23. In addition, each of the output signals b, c, d, e, a', b', c', d', and e' is the inverse of each of the output signals a, b, c, d, e, a', b', c', and d'. The test clock generating circuit 106 receives the plurality of clock signals from the voltage controlled delay circuit 105 and then generates the plurality of test clock signals 1 to 3 using the same means as provided by the normal clock generating circuit 103, as shown in FIG. 23.

When it is necessary to hold each of the plurality of test clock signals at a given level in test mode, the prior art internal clock generating circuitry constructed as above can hold the levels of the plurality of test clock signals 1 to 3 by holding the level of the input clock signal applied to the input terminal Xin because the level of the clock signal furnished by each stage of the voltage controlled delay circuit 105 is held. FIG. 23 shows the waveforms of the plurality of clock signals applied to the circuitry and generated in the circuitry in test mode when the level of the input clock signal applied to the input terminal Xin is held.

A problem with prior art internal clock generating circuitry constructed as above is that it is necessary to apply a clock signal having the same frequency as one internal clock signal from outside the circuitry in order to generate a plurality of test clock signals respectively having the same frequencies as the plurality of normal clock signals generated and furnished by a feedback loop including a VCO, and the degree of difficulty in supplying the clock signal having the same frequency as one internal clock signal from outside the circuitry and hence generating the plurality of test clock signals is increased as the internal clock speed increases.

SUMMARY OF THE INVENTION

The present invention is proposed to solve the above problem. It is therefore an object of the present invention to provide internal clock generating circuitry capable of generating a plurality of test clock signals based on an input signal from outside the circuitry and stopping the generation of them even when the internal clock speed is high.

In accordance with one aspect of the present invention, there is provided internal clock generating circuitry comprising: a phase comparator for comparing the phase of a clock signal applied thereto from outside the circuitry with that of a feedback signal fed back thereto, and for generating a voltage corresponding to the difference between the phases of those clock signals; a voltage-controlled oscillator or VCO for generating a clock signal having a frequency corresponding to the voltage from the phase comparator; a normal clock signal generating circuit for generating at least one normal clock signal used for making an internal circuit operate under normal conditions from the clock signal from the VCO, and for generating and feeding the feedback signal back to the phase comparator; a test VCO for generating a clock signal having a frequency corresponding to the voltage from the phase comparator; a test clock signal generating circuit for generating at least one test clock signal used for testing the internal circuit from the clock signal from the test VCO; a selector for selecting either the normal clock signal generated by the normal clock signal generating circuit or the test clock signal generated by the test clock signal generating circuit, and for furnishing the selected clock signal to the internal circuit; and a control signal generating circuit for generating a control signal to stop the test VCO according to an input signal applied thereto from outside the circuitry.

In accordance with a preferred embodiment of the present invention, the test VCO includes a plurality of inverters connected in a loop, one of which can hold an output level according to the control signal from the control signal generating circuit.

Preferably, the test VCO includes a plurality of switching transistors each of which is connected between an output of a corresponding one of the plurality of inverters and a voltage source or ground. In addition, the control signal from the control signal generating circuit is applied to a control electrode of one switching transistor connected between the output of the one of the plurality of inverters that can hold an output level and the voltage source or ground, and a control electrode of each of other switching transistors connected between the output of each of other inverters and the voltage source or ground is connected to the voltage source or ground so that each of the other switching transistors is brought out of conduction.

In accordance with another preferred embodiment of the present invention, the control signal generating circuit receives one or more test clock signals so as to hold the levels of the one or more test clock signals, when testing the internal.

Preferably, the control signal generating circuit includes a selecting unit for enabling or disabling an input of at least one of the one or more test clock signals. To this end, the internal clock generating circuitry can further include a register for generating and furnishing a control signal to the selecting unit to cause the selecting unit to enable or disable the input of at least one of the one or more test clock signals.

Further objects and advantages of the present invention will be apparent from the following description of the preferred embodiments of the invention as illustrated in the accompanying drawings.

DETAILED DESCRIPTION OF THE PREFERRED EMBODIMENTS

Embodiment 1

Figure 1:
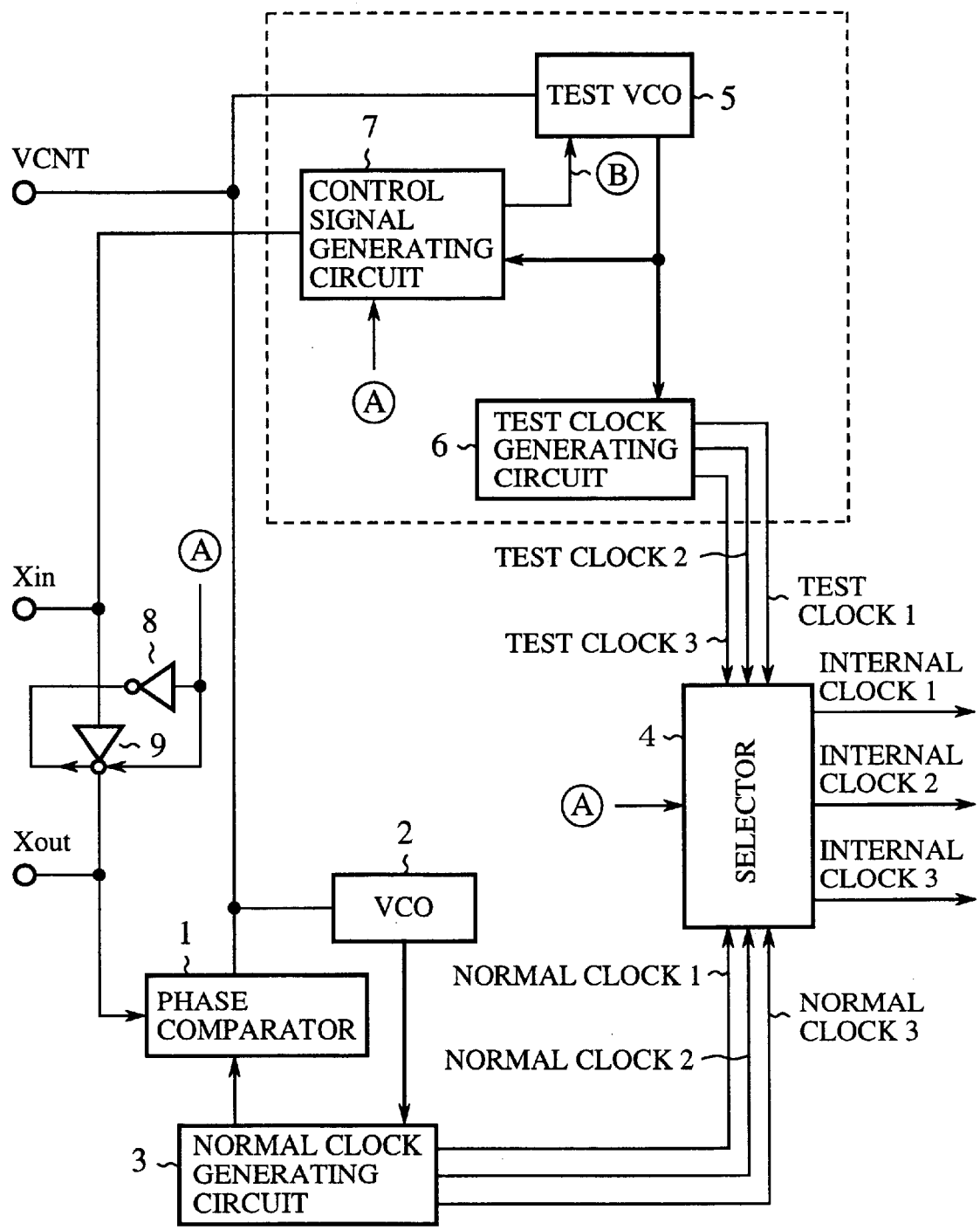
FIG. 1 is a schematic circuit diagram showing the structure of internal clock generating circuitry having a testing function, according to a first embodiment of the present invention.

Referring next to FIG. 1, a schematic circuit diagram is illustrated showing the structure of internal clock generating circuitry having a testing function, according to a first embodiment of the present invention. In the figure, reference numeral 1 denotes a phase comparator for comparing the phases of two input voltages with each other and for generating a voltage VCNT corresponding to the phase difference between those input signals, numeral 2 denotes a VCO for generating a clock signal having a frequency corresponding to the output voltage VCNT from the phase comparator 1, numeral 3 denotes a normal clock generating circuit for generating a plurality of normal clock signals from the clock signal, as an original clock, from the VCO 2 and for furnishing a feedback signal to the phase comparator 1, numeral 4 denotes a selector for switching between the plurality of normal clock signals from the normal clock generating circuit 103 and a plurality of test clock signals described below, numeral 5 denotes a test voltage-controlled oscillator or VCO for generating a clock signal and for holding the level of the clock signal according to the voltage VCNT from the phase comparator 1 and a control signal applied thereto, numeral 6 denotes a test clock generating circuit for generating the plurality of test clock signals from the clock signal, as an original clock, from the test VCO 5, numeral 7 denotes a control signal generating circuit for generating and furnishing the control signal to the test VCO 5, numeral 8 denotes an inverter, and numeral 9 denotes a tristate gate having an inverting function. The VCO 2 generates a clock whose frequency is adjusted according to the voltage VCNT from the phase comparator 1 so that the phase difference between the phases of the two input clock signals applied to the phase comparator 1 becomes small. In addition, reference strings Xin and Xout denote input terminals to which signals are applied from outside the internal clock generating circuitry, and character A denotes a control signal applied in common to the selector 4, the control signal generating circuit 7, and the tristate gate 3.

Figure 2:
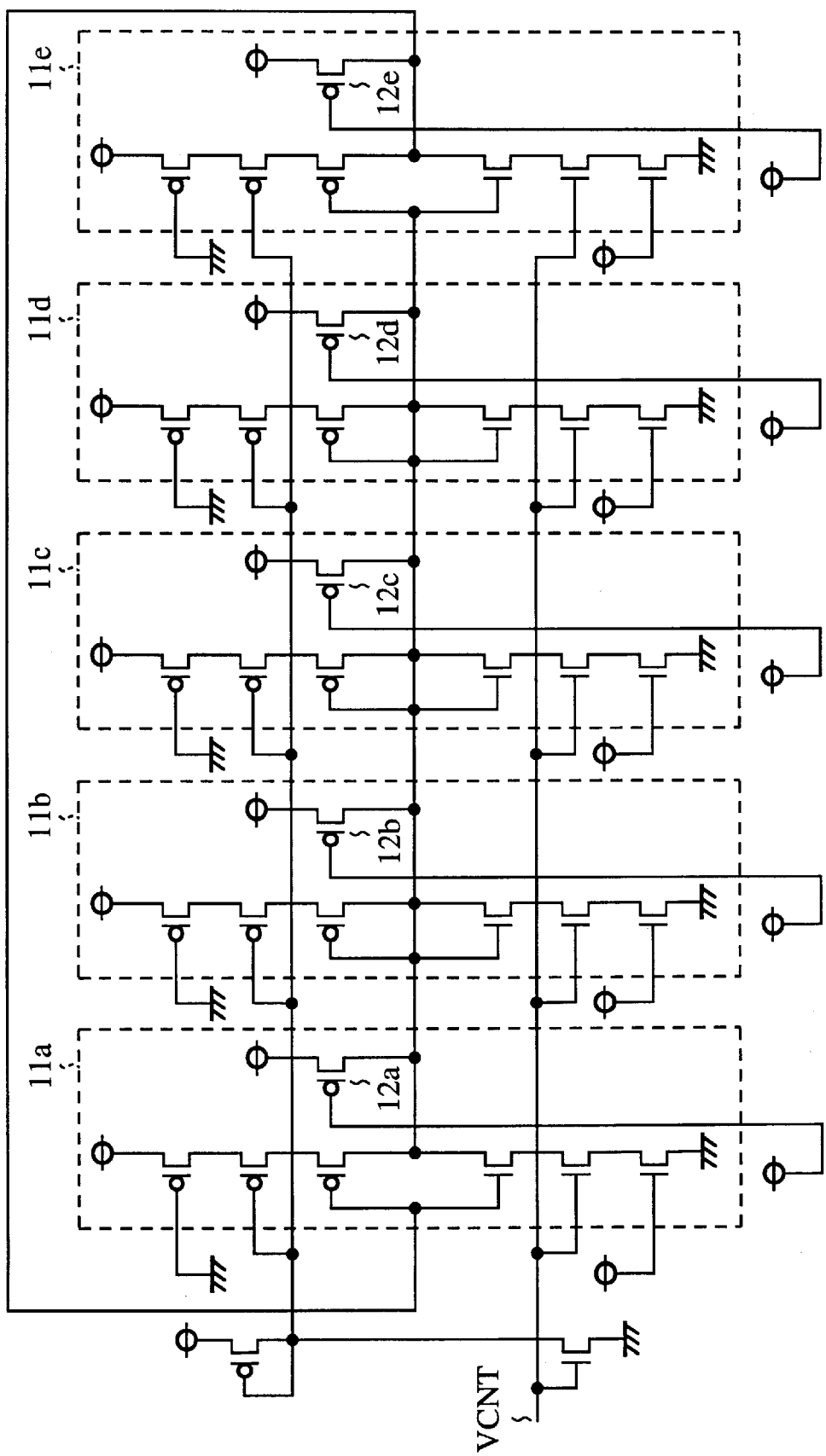
FIG. 2 is a schematic circuit diagram showing the transistor-level structure of a VCO included with the internal clock generating circuitry according to the first embodiment of the present invention.
Figure 18:
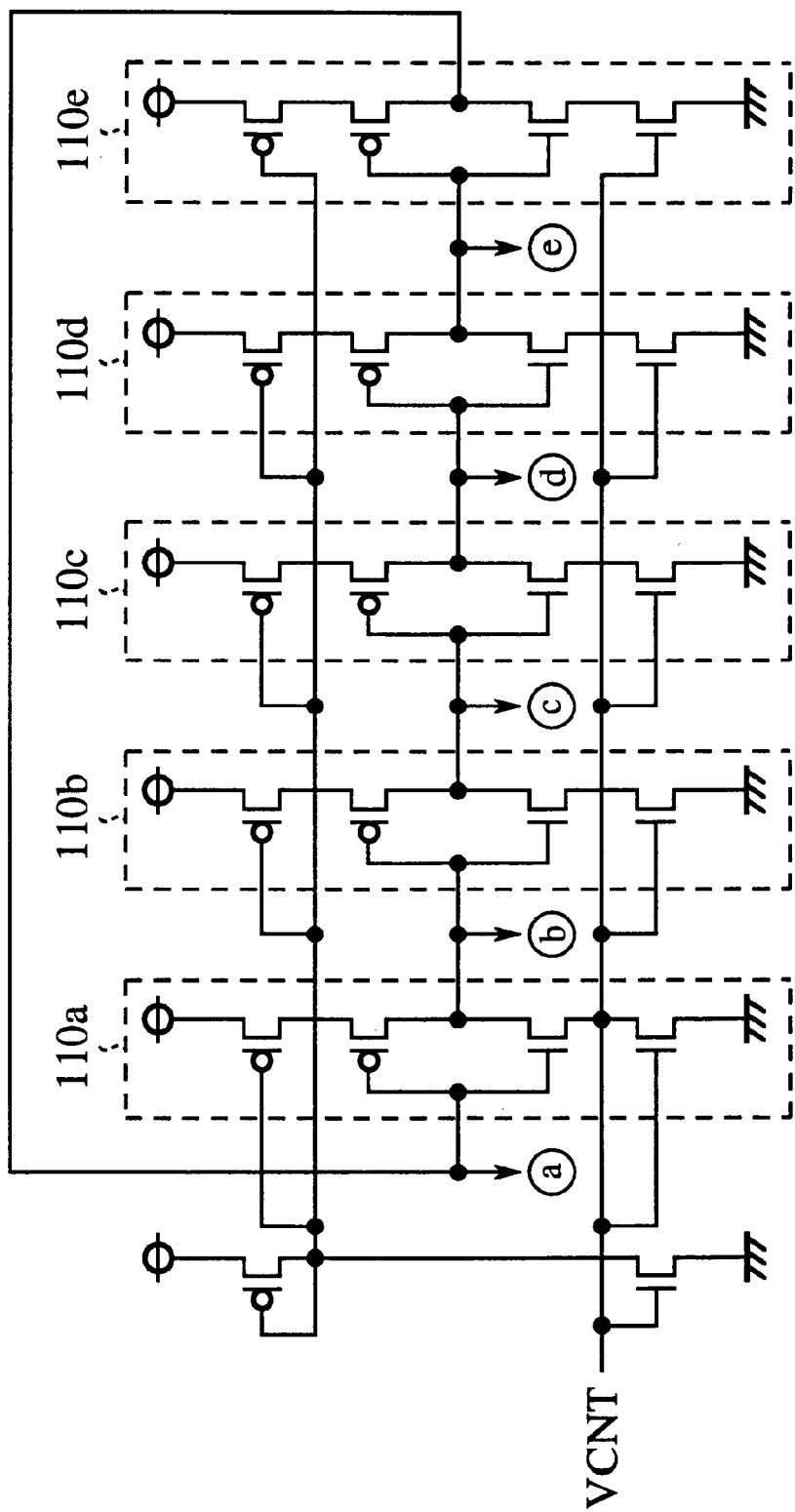
FIG. 18 is a schematic circuit diagram showing the transistor-level structure of a VCO included with the prior art internal clock generating circuitry.
Figure 19:
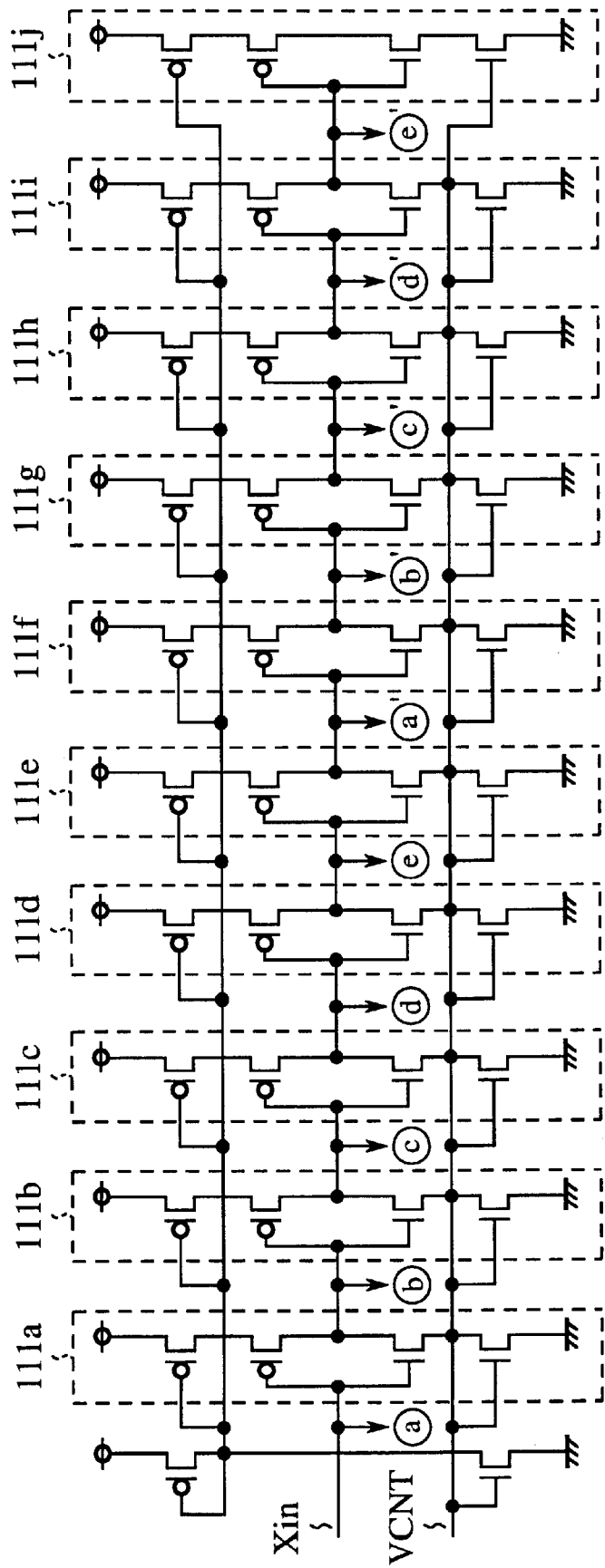
FIG. 19 is a schematic circuit diagram showing the transistor-level structure of a voltage-controlled delay circuit included with the prior art internal clock generating circuitry.

Referring next to FIG. 2, a schematic circuit diagram is illustrated showing the transistor-level structure of the VCO 2. Each of a plurality of transistor groups 11a to 11e, each of which is surrounded by a dashed line in the figure, constitutes an inverter. Changing the control voltage VCNT can control a current flowing through each of the plurality of transistor groups that constitutes each of the plurality of inverters 11a to 11e, thus delaying the transmission of a signal between any two adjacent inverters. It is clear from the comparison between the VCO 2 included with the internal clock generating circuitry according to the first embodiment of the present invention and the VCO 102 included with the prior art internal clock generating circuitry as shown in FIG. 18 that the VCO 2 differs from the conventional VCO 102 in that each inverter at each stage of the VCO 2 includes more transistors in series and the output of each stage is connected, by way of a P-channel transistor 12a, 12b, . . . , or 12e, to a voltage source. Since the control electrode of each of the P-channel transistors 12a to 12e is connected to the voltage source, those P-channel transistors are brought out of conduction at all times.

Figure 3:
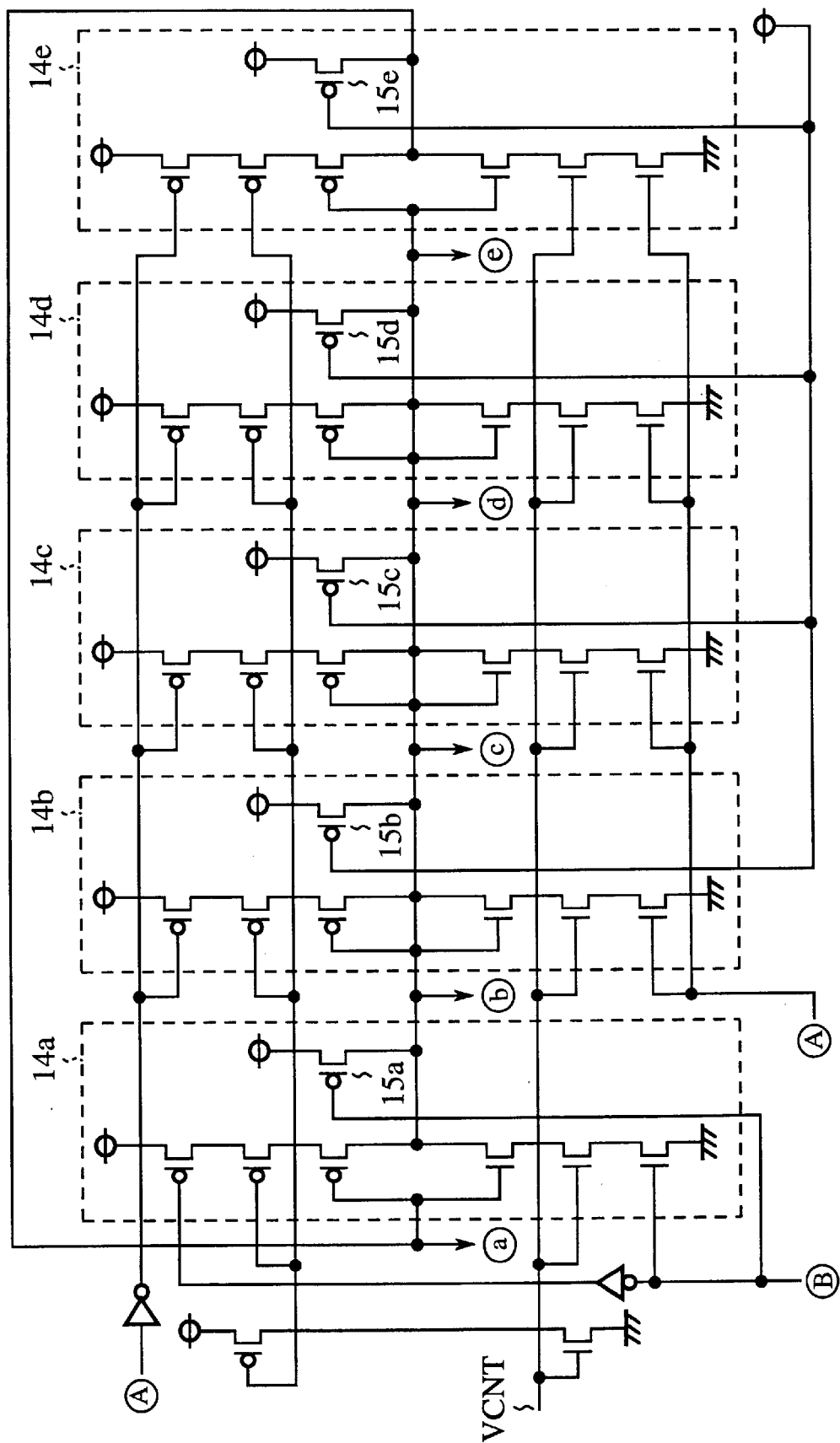
FIG. 3 is a schematic circuit diagram showing the transistor-level structure of a test VCO included with the internal clock generating circuitry according to the first embodiment of the present invention.

Referring next to FIG. 3, a schematic circuit diagram is illustrated showing the transistor-level structure of the test VCO 5. Each of a plurality of transistor groups 14a to 14e, each of which is surrounded by a dashed line in the figure, constitutes an inverter. Even in this circuit, changing the control voltage VCNT can control a current flowing through each of the plurality of transistor groups that constitutes each of the plurality of inverters 14a to 14e, thus delaying the transmission of a signal between any two adjacent inverters. The output of each of the plurality of inverters 14a to 14e at each stage is connected, by way of a P-channel transistor 15a, 15b, . . . , or 15e, to a voltage source. A control signal B furnished by the control signal generating circuit 7 is applied to only the control electrode of the P-channel transistor 15a at the first stage. Since the control electrode of each of the other P-channel transistors 15b to 15e is connected to a voltage source, those P-channel transistors 15b to 15e are brought out of conduction at all times. When the control signal B at a Low level is applied to the first inverter, the transistors in series built therein are interrupted from the voltage source and the ground and the P-channel transistor 15a is switched on. As a result, the output voltage from the first stage is pulled up to a High level. Since the control signal A is at a High level in test mode, the inverters 14b to 14e at the second and later stages operate in the same manner that the inverters 12a to 12e included with the VCO 2 do. In contrast, when the control signal A is at a Low level, the test VCO 5 does not work because the output of each of the second to fifth inverters 14b to 14e has a high impedance. In FIG. 3, reference characters a, b, c, d, and e denote output signals from the plurality of inverters included with the test VCO 5, respectively.

Figure 4:
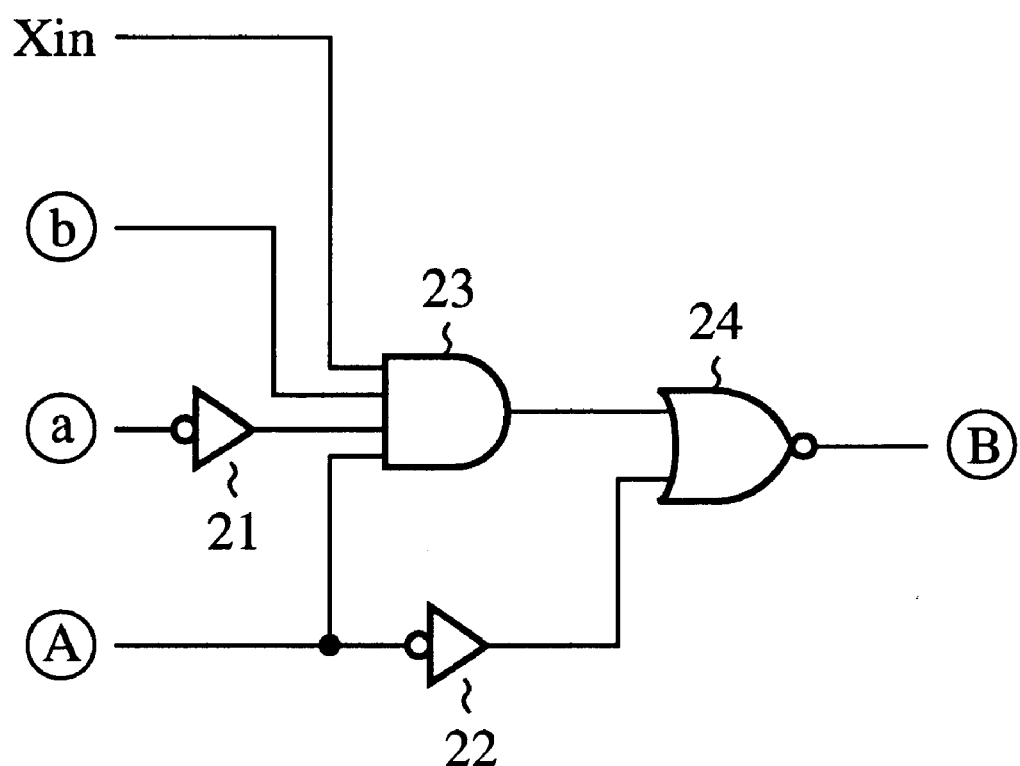
FIG. 4 is a schematic circuit diagram showing the gate-level structure of a control signal generating circuit included with the internal clock generating circuitry according to the first embodiment of the present invention.

Referring next to FIG. 4, it illustrates the gate-level structure of the control signal generating circuit 7. In the figure, reference numerals 21 and 22 denote inverters, respectively, numeral 23 denotes an AND gate, numeral 24 denotes a NOR gate. Provided that the control signal A is at a High level, the control signal B is at a Low level only if the input signal applied to the input terminal Xin is at a High level, the output signal a from the test VCO 5 is at a Low level, and the output signal b from the test VCO 5 is a High level. Otherwise, the control signal B is at a High level.

Figure 20:
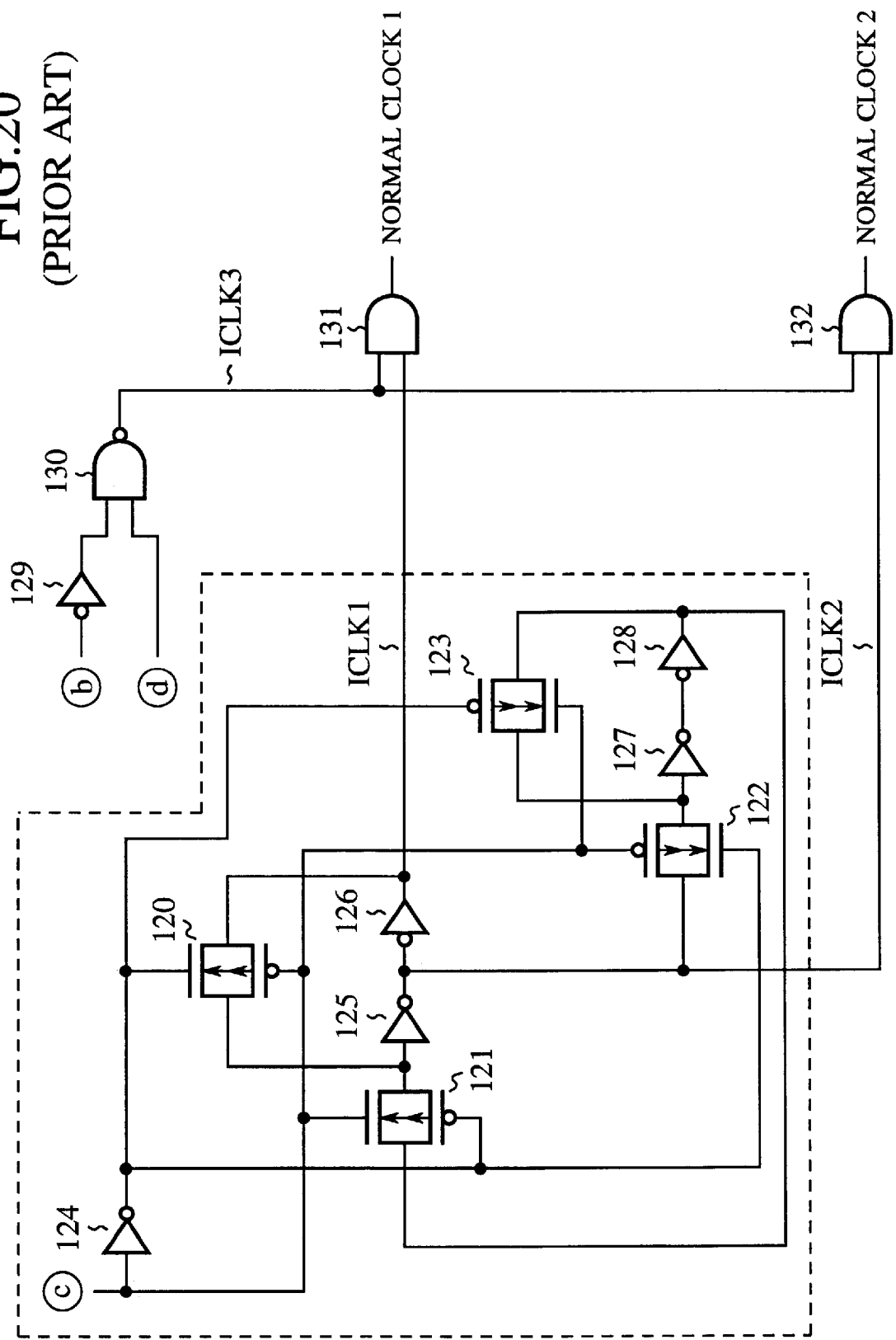
FIG. 20 is a schematic circuit diagram showing the structure of an example of a circuit included with the internal clock generating circuitry, for generating normal clock signals from a clock signal from the VCO as shown in FIG. 18.
Figure 21:
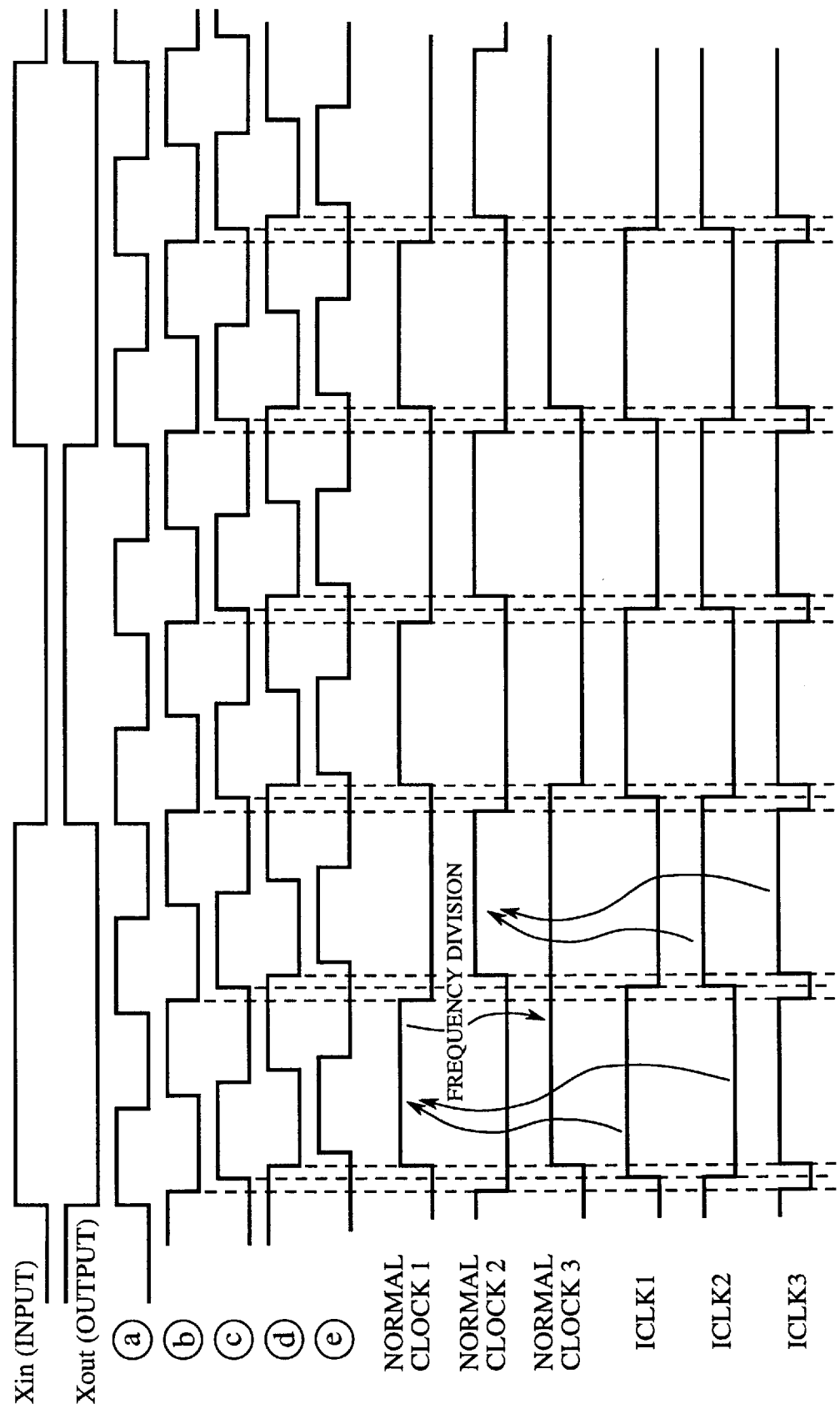
FIG. 21 is a timing chart showing the waveforms of clock signals applied to and generated in the prior art internal clock generating circuitry under normal conditions.
Figure 22:
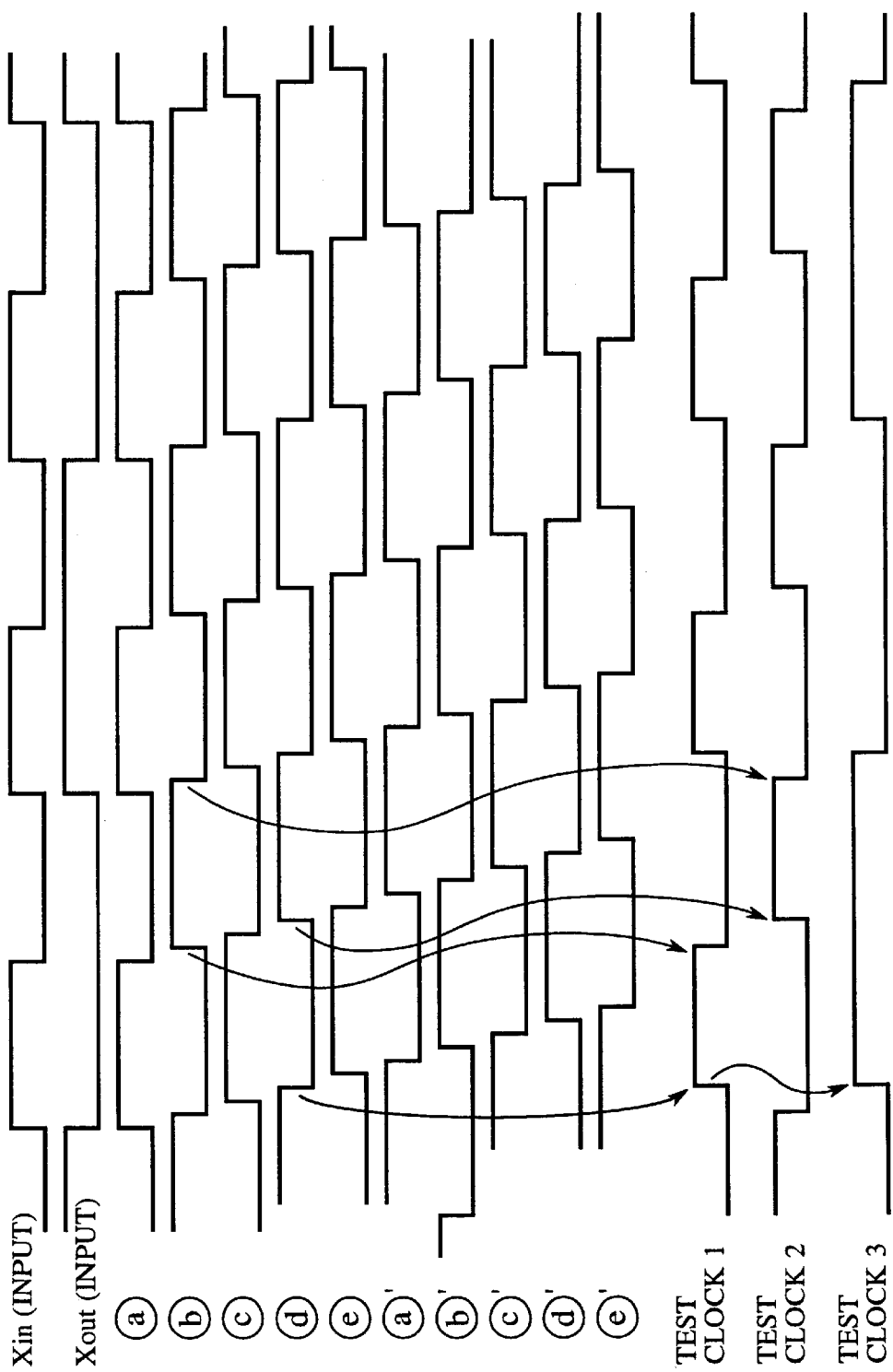
FIGS. 22 and 23 are timing charts showing the waveforms of clock signals applied to and generated in the prior art internal clock generating circuitry in test mode.
Figure 23:
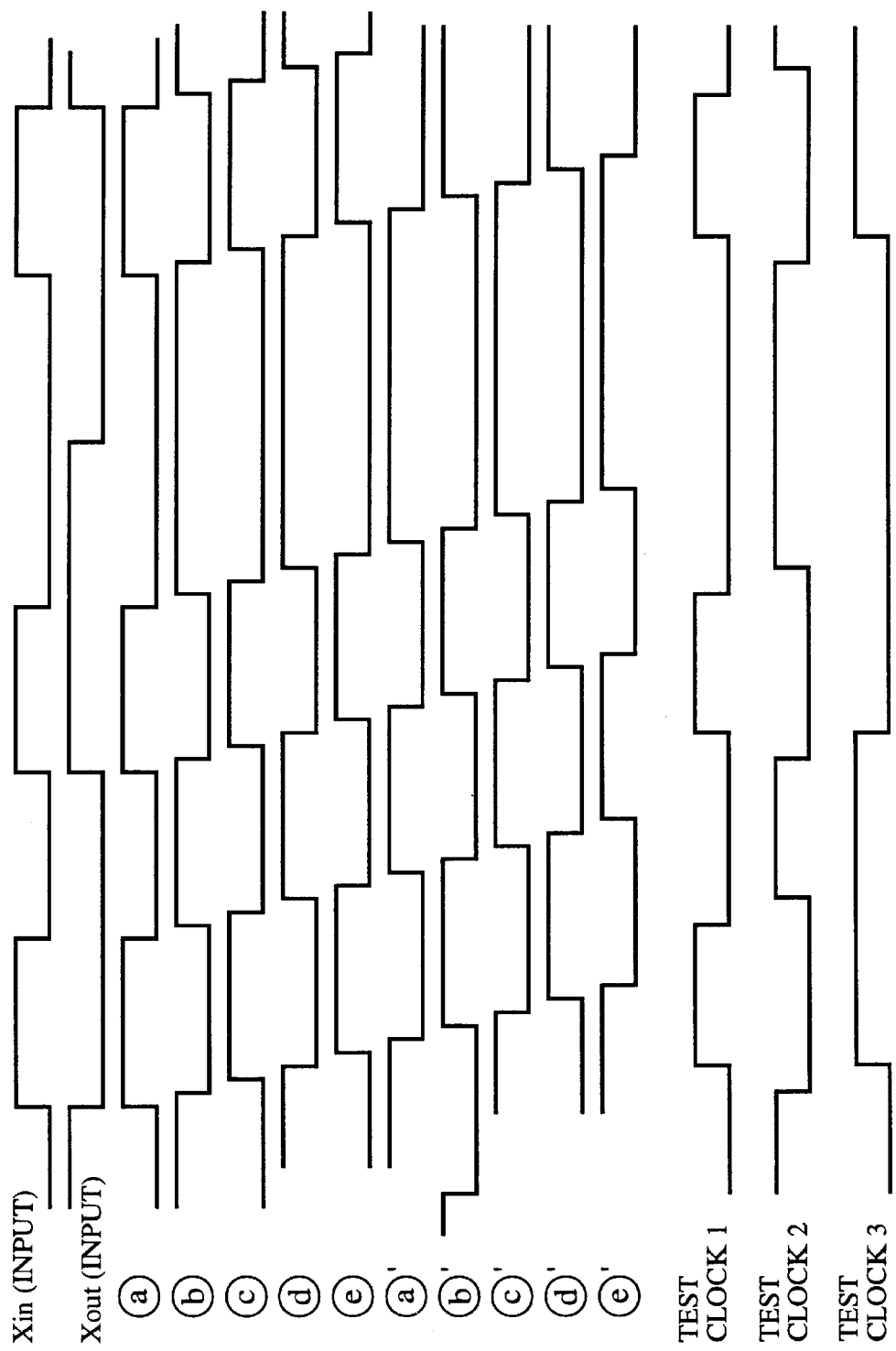

The normal clock generating circuit 3 has the same structure as the corresponding normal clock generating circuit, as shown in FIG. 20, included with the prior art internal clock generating circuitry. Similarly, the test clock generating circuit 6 has the same structure as the corresponding test clock generating circuit, as shown in FIG. 20, included with the prior art internal clock generating circuitry. The normal clock generating circuit 3 generates a plurality of normal clock signals 1 to 3. The test clock generating circuit 6 generates a plurality of test clock signals 1 to 3.

Under normal conditions, the control signal A at a Low level is applied to the tristate gate 9, and the selector 4, so that the tristate gate 9 is brought into conduction and the selector 4 selects the plurality of normal clock signals 1 to 3 as a plurality of internal clock signals 1 to 3. As a result, the clock signal applied to the input terminal Xin is then furnished, by way of the other input terminal Xout, to the phase comparator 1. The phase comparator 1 compares the phase of the clock signal applied to the input terminal Xin with that of the clock signal fed back thereto from the normal clock generating circuit 3, and then generates and furnishes a voltage VCNT corresponding to the phase difference between those clock signals to the VCO 2. The VCO 2 oscillates according to the voltage VCNT to supply an original clock signal to the normal clock generating circuit 3 to enable the normal clock generating circuit to generate the plurality of normal clock signals. The normal clock generating circuit 3 divides the frequency of the input original clock signal to generate the plurality of normal clock signals 1 to 3, and then generates and feeds a clock signal back to the phase comparator 1. In this embodiment, the normal clock generating circuit 3 divides the frequency of the original clock by 8 and then feeds the frequency-divided clock signal back to the phase comparator 1. In this manner, the normal clock generating circuit 3 generates the plurality of normal clock signals 1 to 3 in cooperation with the phase comparator 1, and the VCO 2, which constitute a feedback loop together with the normal clock generating circuit 3. In the prior art mentioned above, the VCO furnishes a clock signal having a frequency four times as large as that of an input clock signal applied thereto the VCO. In contrast, the VCO 2 of this embodiment furnishes a clock signal having a frequency eight times as large as that of an input clock signal applied thereto. In other words, the frequency multiplication is two times as large as that provided by the VCO included with the prior art.

Figure 5:
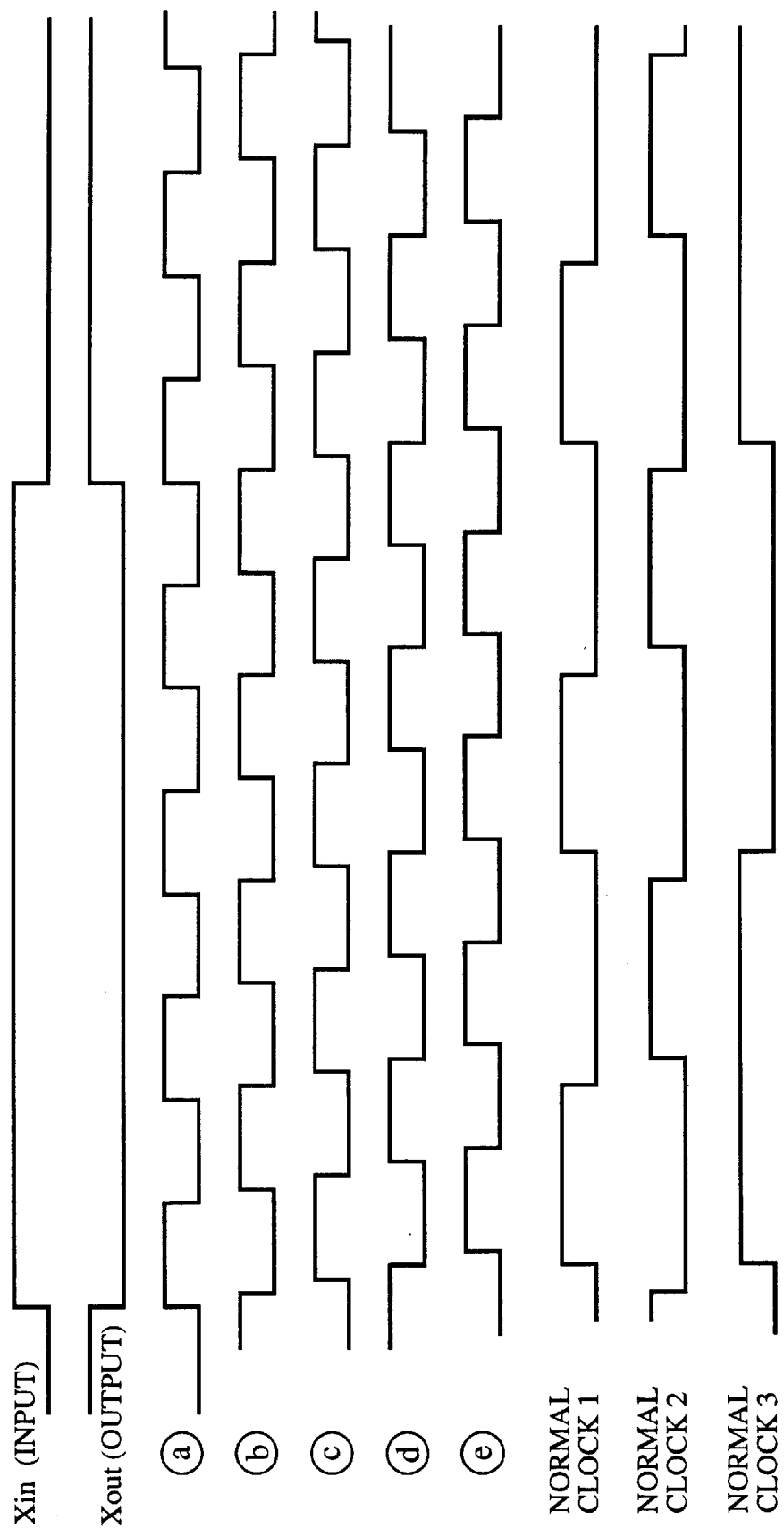
FIG. 5 is a timing chart showing the waveforms of clock signals applied to the internal clock generating circuitry and generated in the circuitry under normal conditions.

The normal clock generating circuit 3 generates the plurality of normal clock signals 1 to 3 on the basis of the output signals a, b, c, d, and e from the VCO 2 in the same manner that the normal clock generating circuit 103 of the prior art internal clock generating circuitry does. Therefore, the detailed description of the normal clock generating circuit 3 will be omitted hereinafter. FIG. 5 shows the waveforms of the plurality of clock signals applied to the circuitry and generated in the circuitry under normal conditions.

Figure 6:
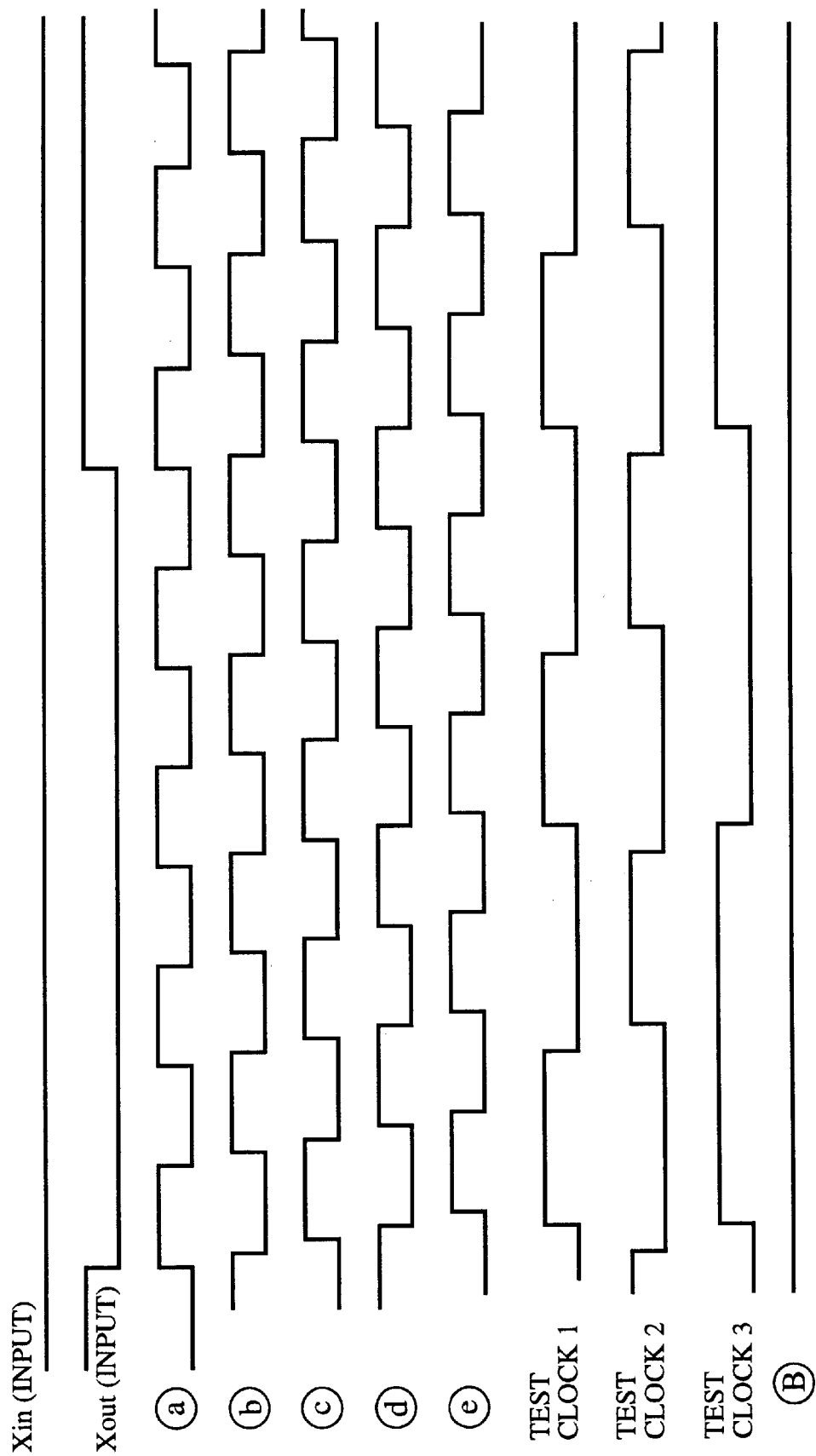
FIGS. 6, 7 and 8 are timing charts showing the waveforms of the clock signals applied to the internal clock generating circuitry and generated in the circuitry in test mode.
Figure 7:
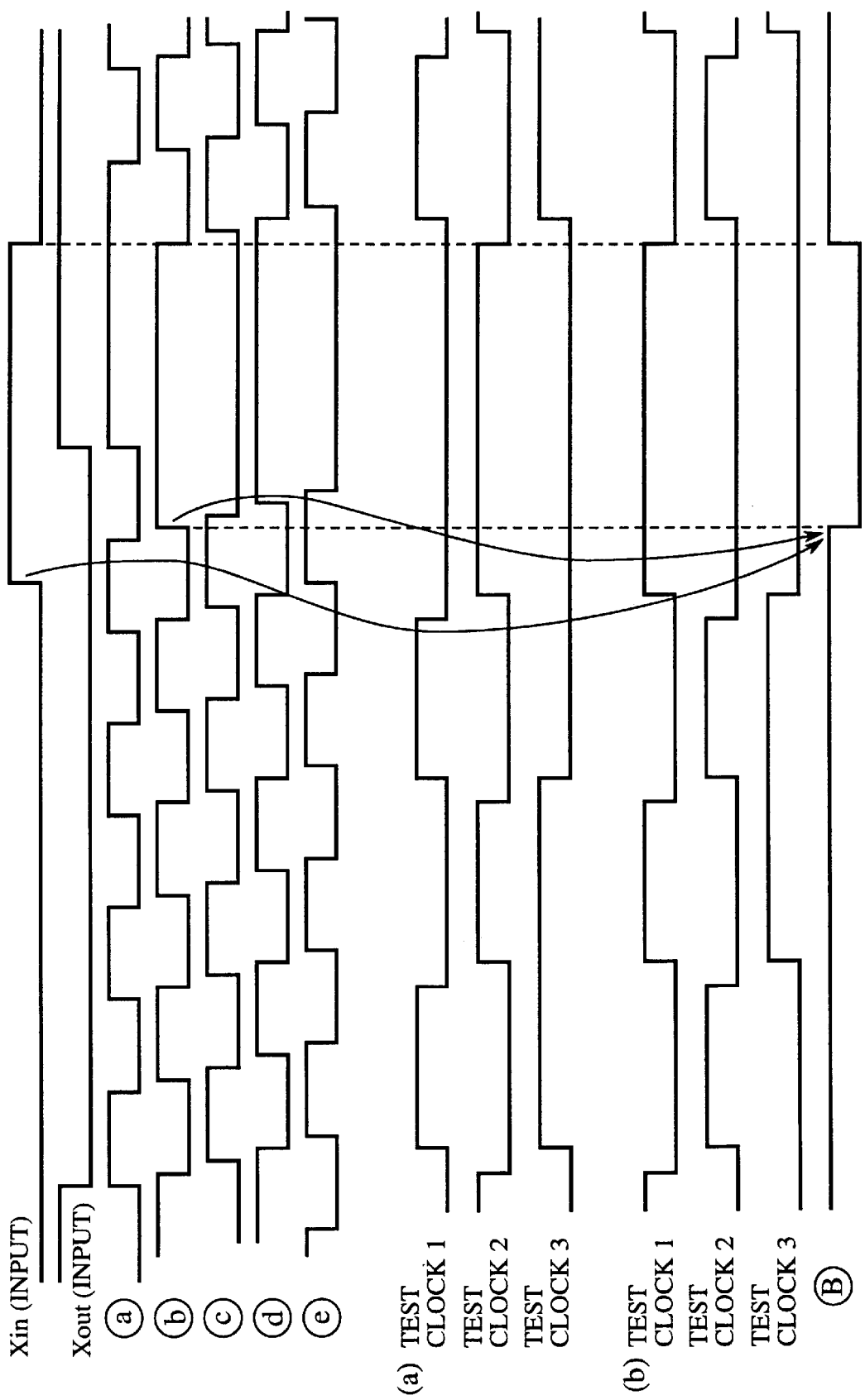
Figure 8:
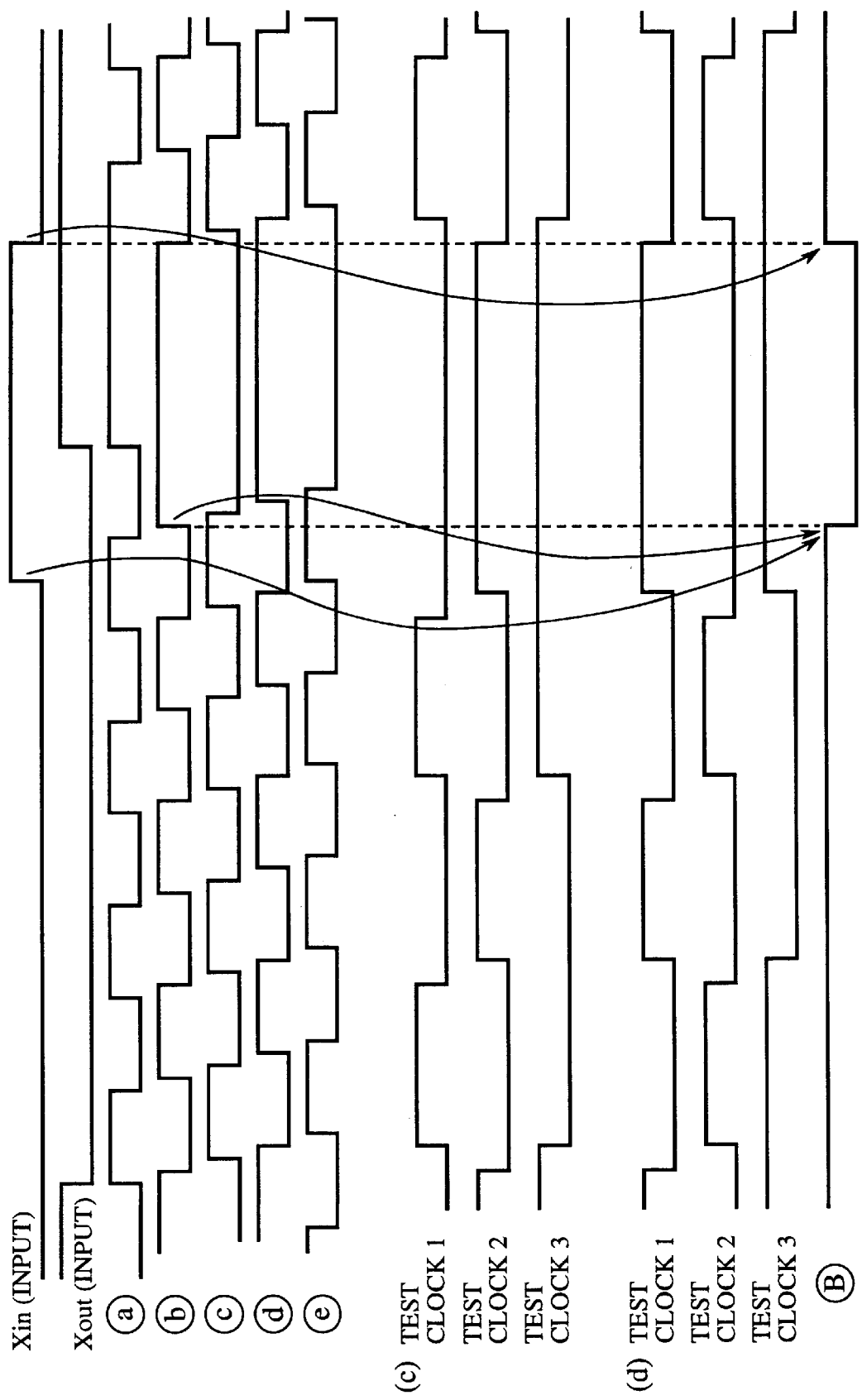

Next, a description will be made as to the operation of the internal clock generating circuitry that is placed in test mode. FIGS. 6, 7 and 8 are timing charts showing the waveforms of the plurality of clock signals applied to the circuitry and generated in the circuitry in test mode. In test mode, the control signal A at a High level is applied to the tristate gate 9, the selector 4 and so on. This results in bringing the tristate gate 9 out of conduction, and then causing a high impedance between the input terminals Xin and Xout. The selector 4 selects the plurality of test clock signals 1 to 3 as the plurality of internal clock signals 1 to 3. Under this condition, the clock signal applied to the input terminal Xout is the same as that applied to the input terminal Xout under normal conditions. The feedback loop comprised of the phase comparator 1, the VCO 2, and the normal clock generating circuit 3 operates in the same manner that it does under normal conditions, so that the phase comparator 1 supplies an output voltage VCNT corresponding to the phase difference between the two input clock signals to the VCO 2. Since the voltage VCNT is also applied to the test VCO 5, the test VCO 5 oscillates at the same frequency as that at which the VCO 2 oscillates. Referring next to FIG. 6, it illustrates the waveforms of the plurality of clock signals applied to the circuitry and generated in the circuitry when the control signal B is held at a High level. It is apparent from the comparison between FIGS. 5 and 6 that the test clock generating circuit 6 generates the plurality of test clock signals 1 to 3 having the same waveforms as the plurality of normal clock signals 1 to 3, respectively, while the control signal B is held at a High level.

In test mode wherein the control signal A at a High level is applied to the circuitry, when the input signal applied to the input terminal Xin makes a Low to High transition and the output signals a and b from the test VCO 5 then go Low and High, respectively, the control signal B from the control signal generating circuit 7 makes a High to Low transition. When the control signal B goes Low, the group of transistors in series in the first inverter 14a included with the test VCO 5 is interrupted from the voltage source and ground. Further, the P-channel transistor 15a for pulling up the output signal b is switched on. As a result, the output signals a, b, c, d, and e from the test VCO 5 are held at a High level, a High level, a Low level, a High level, and a Low level, respectively. According to those output signals, the levels of the plurality of test clock signals 1 to 3 are also held. In this case, since the output level of the inverter 14a is held, one-half of one clock cycle of the clock signal furnished by the test VCO 5 elapses until the test VCO 5 stops after the output levels of all the inverters included with the test VCO have been held.

After the control signal B makes a High to Low transition, the plurality of test clock signals 1 to 3 are held at certain levels, respectively. In this case, the plurality of test clock signals 1 to 3 can have respective waveforms selected from four sets of waveforms as shown by (a) and (b) of FIG. 7, and (c) and (d) of FIG. 8. When the input signal applied to the input terminal Xin makes a High to Low transition and the control signal B returns to a High level, a clock signal having a predetermined frequency is successively applied, by way of the other input terminal Xout, to the circuitry and the voltage VCNT having a certain value is supplied to the test VCO 5. As a result, the test VCO 5 returns to a normal oscillating state in which it oscillates at a proper frequency to generate the plurality of test clock signals 1 to 3 under normal conditions immediately after the holding state based on the control signal B at a Low level is released.

As previously mentioned, in accordance with the first embodiment of the present invention, the internal clock generating circuitry is provided with the test VCO 5 for generating a clock signal having a frequency corresponding to the control voltage furnished by the phase comparator 1, the test clock generating circuit 6 for generating the plurality of test clock signals 1 to 3 from the clock signal from the test VCO 5, and the control signal generating circuit 7 for generating the control signal B to stop the test VCO 5 according to the input signal applied to the input terminal Xin. In other words, the test VCO 5 can share the control voltage from the phase comparator 1 with the VCO 2 so as to allow the test clock generating circuit to generate the plurality of test clock signals 1 to 3. As a result, the internal clock generating circuitry of this embodiment can generate the plurality of test clock signals 1 to 3 based on a clock signal, which is furnished from outside the circuitry, having the same frequency as a clock signal required for generating the plurality of normal clock signals 1 to 3 under normal conditions. In addition, the internal clock generating circuitry can stop the generation of the plurality of normal clock signals by only applying a control signal to stop the generation of the plurality of normal clock signals from outside the circuitry to the control signal generating circuit 7. The internal clock generating circuitry can generate the plurality of test clock signals 1 to 3 using the two input signals at low frequencies applied to the input terminals Xin and Xout without having to apply a clock signal having the same frequency as the plurality of internal clock signals from outside the circuitry. Accordingly, the first embodiment offers the advantage of being able to easily test an internal circuit.

Since the test VCO 5 is constructed of the plurality of inverters 14a to 14e connected in a loop and the output level of the first inverter 14a included with the test VCO 5 is held according to the control signal B from the control signal generating circuit 7, the control signal generating circuit 7 can furnish the control signal B to the test VCO 5 at any time, and only one-half of one clock cycle of the clock signal furnished by the test VCO 5 is thus spent until stopping the test VCO 5 after the output levels of all the inverters connected in a loop within the test VCO have been held. Accordingly, the first embodiment offers the advantage of being able to hold the levels of the plurality of test clock signals 1 to 3 in a short time, thus testing the internal circuit speedily with reliability.

In addition, since each of the second and later inverters 14b to 14e included with the test VCO 5 comprises a voltage source and a switching transistor 15b, . . . , or 15e disposed at an output, like the first inverter 14a, those inverters have nearly the same structure and the same characteristics. Accordingly, the first embodiment offers the advantage of being able to make the plurality of test signals from the test VCO 5 become stable, thus testing the internal circuit with reliability.

Embodiment 2

Figure 9:
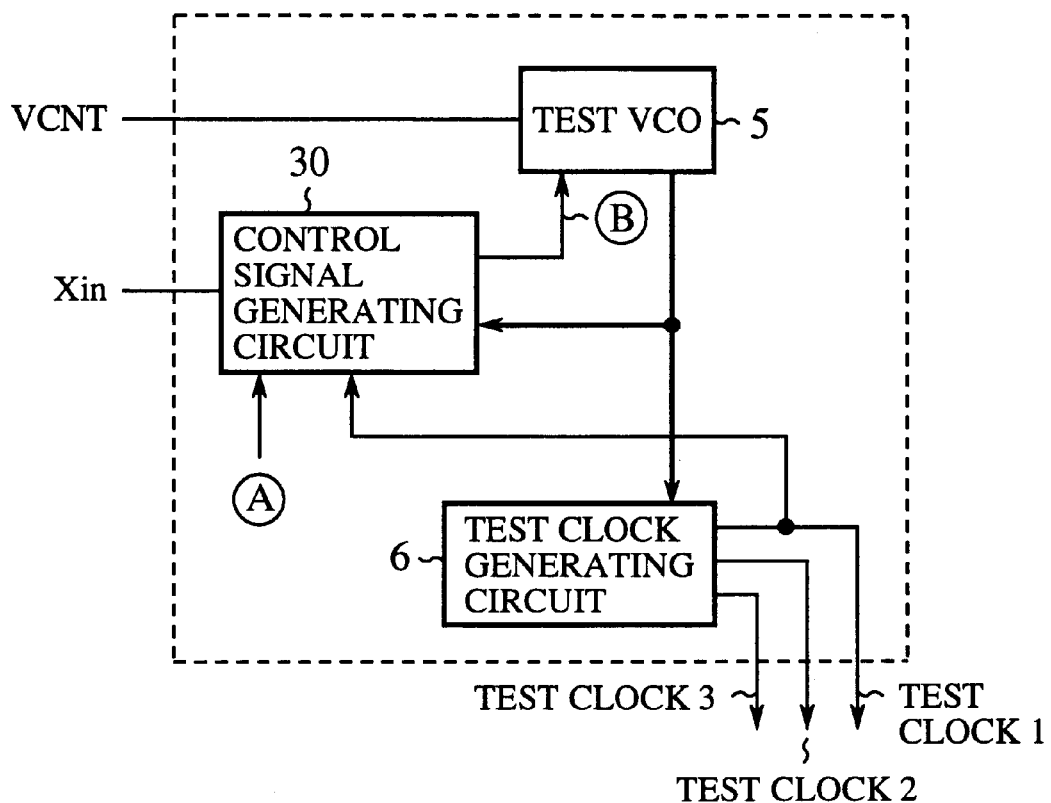
FIG. 9 is a schematic circuit diagram showing the structure of a characterized part of internal clock generating circuitry having a testing function according to a second embodiment of the present invention.

Referring next to FIG. 9, a schematic circuit diagram is illustrated showing the structure of a characterized part of internal clock generating circuitry having a testing function according to a second embodiment of the present invention. The characterized part as shown in FIG. 9 corresponds to the part of FIG. 1 surrounded by a dashed line. In FIG. 9, the same reference numerals as shown in FIG. 1 denote the same components as of the first embodiment or like components. Reference numeral 30 denotes a control signal generating circuit having a structure different from that of the control signal generating circuit 7 as shown in FIG. 1, for furnishing a control signal B to a test VCO 5. In the second embodiment, a test clock signal 1 is applied to the control signal generating circuit 30.

Figure 10:
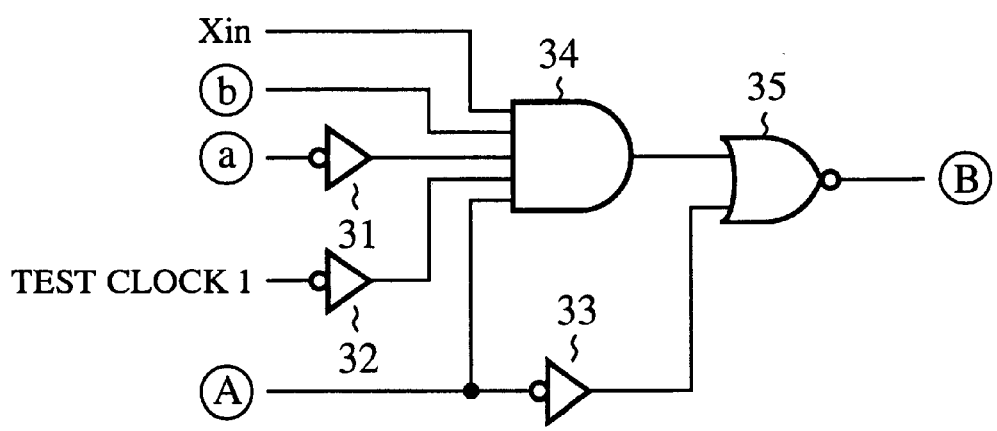
FIG. 10 is a schematic circuit diagram showing the gate-level structure of a control signal generating circuit included with the internal clock generating circuitry according to the second embodiment of the present invention.

Referring next to FIG. 10, a schematic circuit diagram is illustrated showing the gate-level structure of the control signal generating circuit 30. In the figure, reference numerals 31, 32 and 33 denote inverters, numeral 34 denotes an AND gate, and numeral 35 denotes a NOR gate. Provided that a control signal A is at a High level, the control signal B is at a Low level only if an input signal applied to the input terminal Xin is at a High level, an output signal a from the test VCO 5 is at a Low level, and an output signal b from the test VCO 5 is a High level. Otherwise, the control signal B is at a High level.

Figure 11:
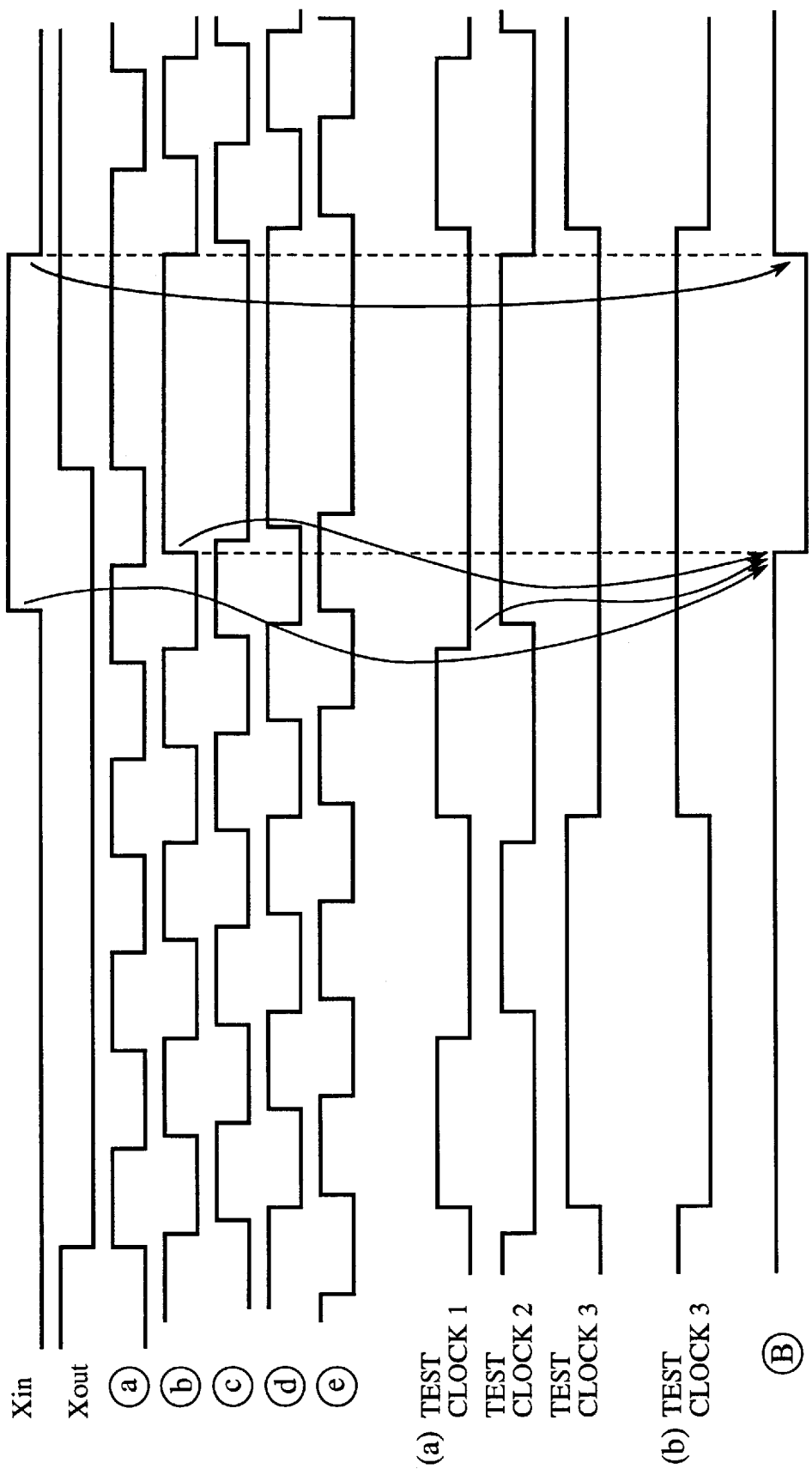
FIG. 11 is a timing charts showing the waveforms of clock signals applied to and generated in the internal clock generating circuitry according to the second embodiment of the present invention in test mode.

FIG. 11 is a timing chart showing the waveforms of a plurality of clock signals applied to the circuitry and generated in the circuitry in test mode. In test mode wherein the control signal A at a High level is applied to the circuitry, when the input signal applied to the input terminal Xin makes a Low to High transition and the output signals a and b from the test VCO 5 then go Low and High, respectively, the control signal B from the control signal generating circuit 30 makes a High to Low transition. When the control signal B goes Low, the output signals a, b, c, d, and e from the test VCO 5 are held at certain levels, respectively. According to those output signals, the levels of the plurality of test clock signals 1 to 3 are also held. In this embodiment, since the test clock signal 1 is applied to the control signal generating circuit 30, the test clock signals 1 and 2 have certain levels, respectively, when they are held. In contrast, the test clock signal 3, which has been obtained by dividing the clock signal from the test VCO with a high frequency division factor, can have one of two levels as shown in FIG. 11 when it is held.

As previously mentioned, the second embodiment of the present invention makes it possible to hold the test clock signals 1 and 2 at certain levels when stopping the generation of the plurality of normal clock signals, thus easily making a device including an internal circuit to be tested and the internal clock generating circuitry of the second embodiment in synchronization with a tester when testing the internal circuit. Accordingly, the second embodiment offers the advantage of being able to easily test the internal circuit with stability. The second embodiment also offers the same advantage as provided by the first embodiment. In addition, since the internal clock generating circuitry of the second embodiment can generate the plurality of test clock signals having the same feature as of the plurality of normal clock signals generated under normal conditions, a difference does not result between the operation of the internal circuit under normal conditions and that in test mode. In other words, the operation of the internal circuit can be emulated even in test mode.

Embodiment 3

Figure 12:
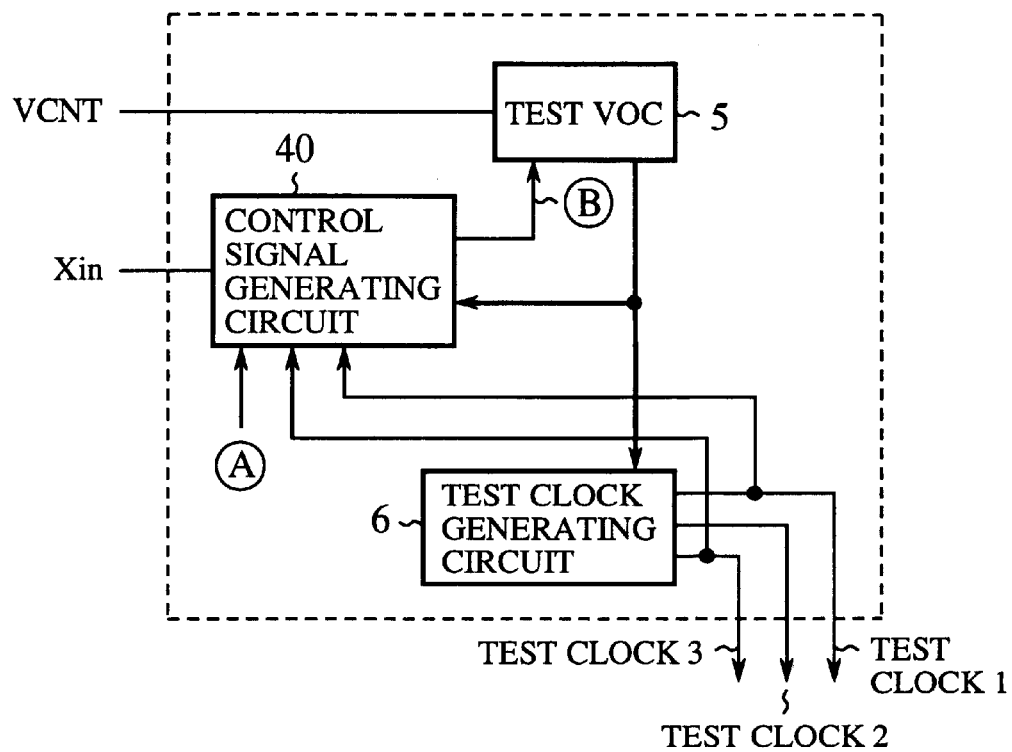
FIG. 12 is a schematic circuit diagram showing the structure of a characterized part of internal clock generating circuitry having a testing function according to a third embodiment of the present invention.

Referring next to FIG. 12, a schematic circuit diagram is illustrated showing the structure of a characterized part of internal clock generating circuitry having a testing function according to a third embodiment of the present invention. The characterized part as shown in FIG. 12 corresponds to the part of FIG. 1 surrounded by a dashed line. In FIG. 12, the same reference numerals as shown in FIG. 1 denote the same components as of the first embodiment or like components, and therefore the description of those components will be omitted hereinafter. Reference numeral 40 denotes a control signal generating circuit having a structure different from that of the control signal generating circuit 7 as shown in FIG. 1, for furnishing a control signal B to a test VCO 5. In the third embodiment, test clock signals 1 and 3 are applied to the control signal generating circuit 40.

Figure 13:
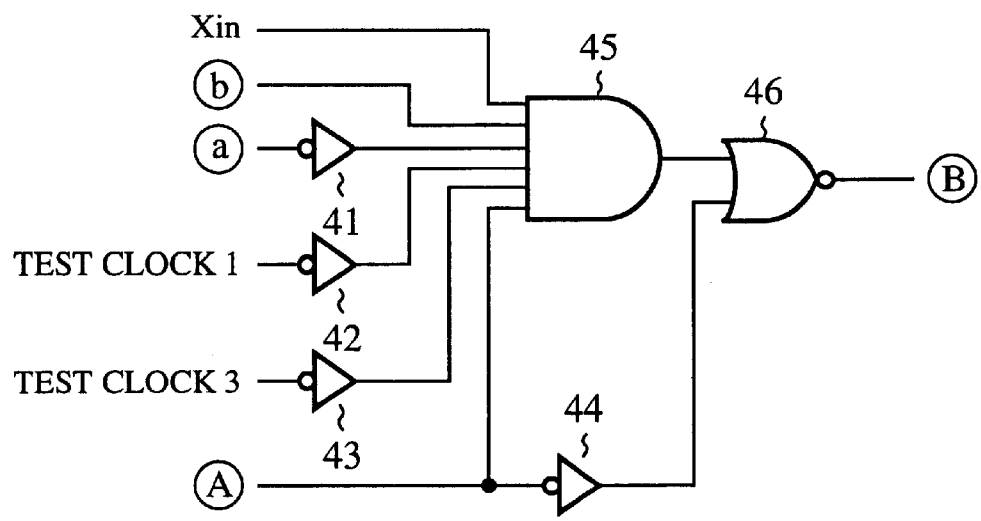
FIG. 13 is a schematic circuit diagram showing the gate-level structure of a control signal generating circuit included with the internal clock generating circuitry according to the third embodiment of the present invention.

Referring next to FIG. 13, a schematic circuit diagram is illustrated showing the gate-level structure of the control signal generating circuit 40. In the figure, reference numerals 41, 42, 43, and 44 denote inverters, numeral 45 denotes an AND gate, and numeral 46 denotes a NOR gate. Provided that a control signal A is at a High level, the control signal B is at a Low level only if an input signal applied to an input terminal Xin is at a High level, an output signal a from the test VCO 5 is at a Low level, and an output signal b from the test VCO 5 is at a High level. Otherwise, the control signal B is at a High level.

Figure 14:
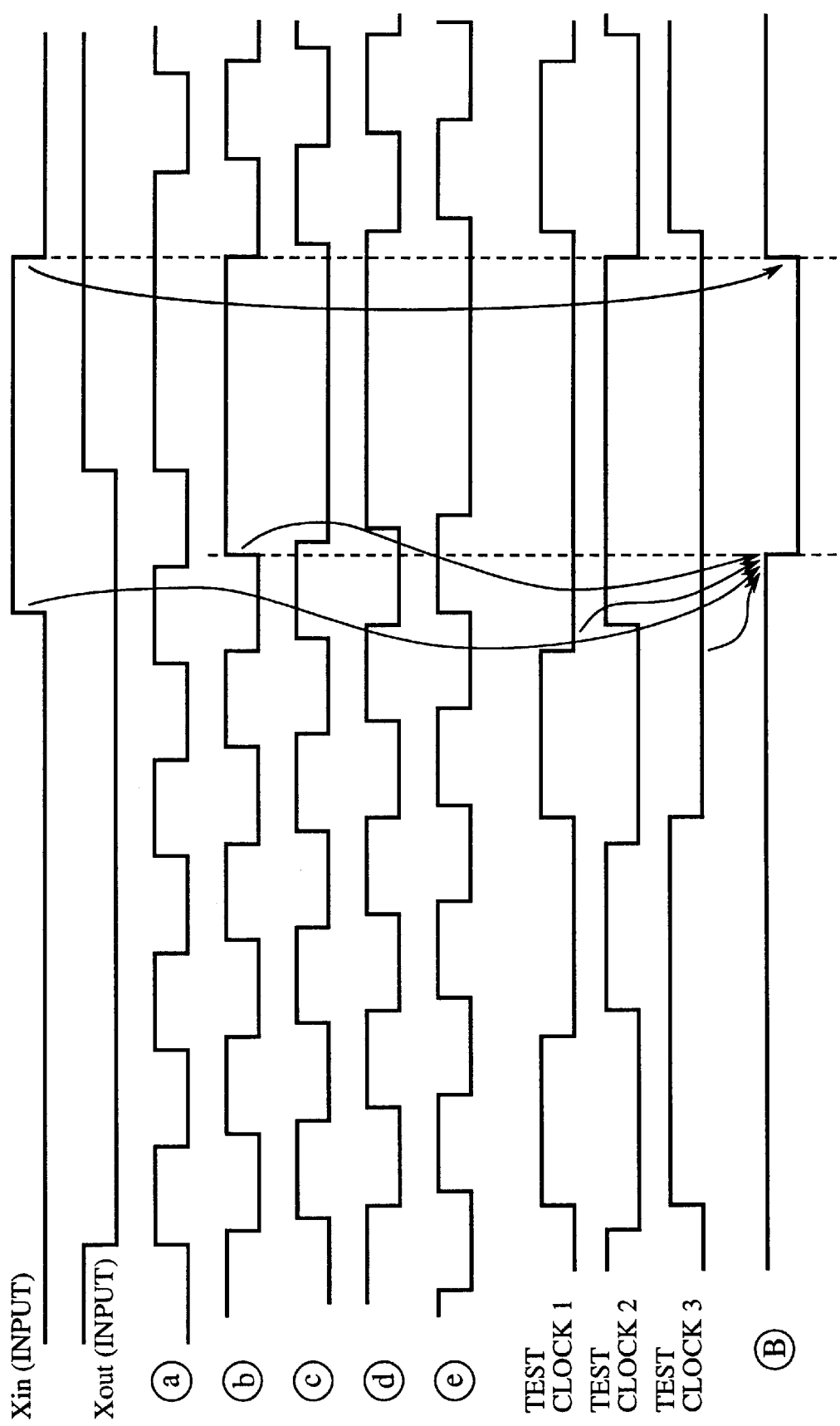
FIG. 14 is a timing charts showing the waveforms of clock signals applied to and generated in the internal clock generating circuitry according to the third embodiment of the present invention in test mode.

FIG. 14 is a timing chart showing the waveforms of a plurality of clock signals applied to the circuitry and generated in the circuitry in test mode. In test mode wherein the control signal A at a High level is applied to the circuitry, when the input signal applied to the input terminal Xin makes a Low to High transition, the output signals a and b from the test VCO 5 then go Low and High, respectively, and the test clock signals 1 and 3 go Low, the control signal B from the control signal generating circuit 40 makes a High to Low transition. When the control signal B goes Low, the output signals a, b, c, d, and e from the test VCO 5 are held at certain levels, respectively, like in the first embodiment. According to those output signals, the levels of the plurality of test clock signals 1 to 3 are also held. In this embodiment, since the test clock signals 1 and 3 are applied to the control signal generating circuit 40, the plurality of test clock signals 1 to 2, i.e., all the internal clock signals 1 to 3 have certain levels, respectively, when they are held. As shown in FIG. 14, each of the plurality of test clock signals 1 to 3 can have only one level when it is held.

As previously mentioned, the third embodiment of the present invention makes it possible to hold all the test clock signals 1 to 3 at certain levels when stopping the generation of the plurality of normal clock signals, thus easily making a device including an internal circuit to be tested and the internal clock generating circuitry of the second embodiment in synchronization with a tester when testing the internal circuit. Accordingly, the third embodiment offers the advantage of being able to easily test the internal circuit with stability. The third embodiment also offers the same advantage as provided by the first embodiment. In addition, since the internal clock generating circuitry of the third embodiment can generate the plurality of test clock signals having the same feature as of the plurality of normal clock signals generated under normal conditions, a difference does not result between the operation of the internal circuit under normal conditions and that in test mode. In other words, the operation of the internal circuit can be emulated even in test mode.

Embodiment 4

Figure 15:
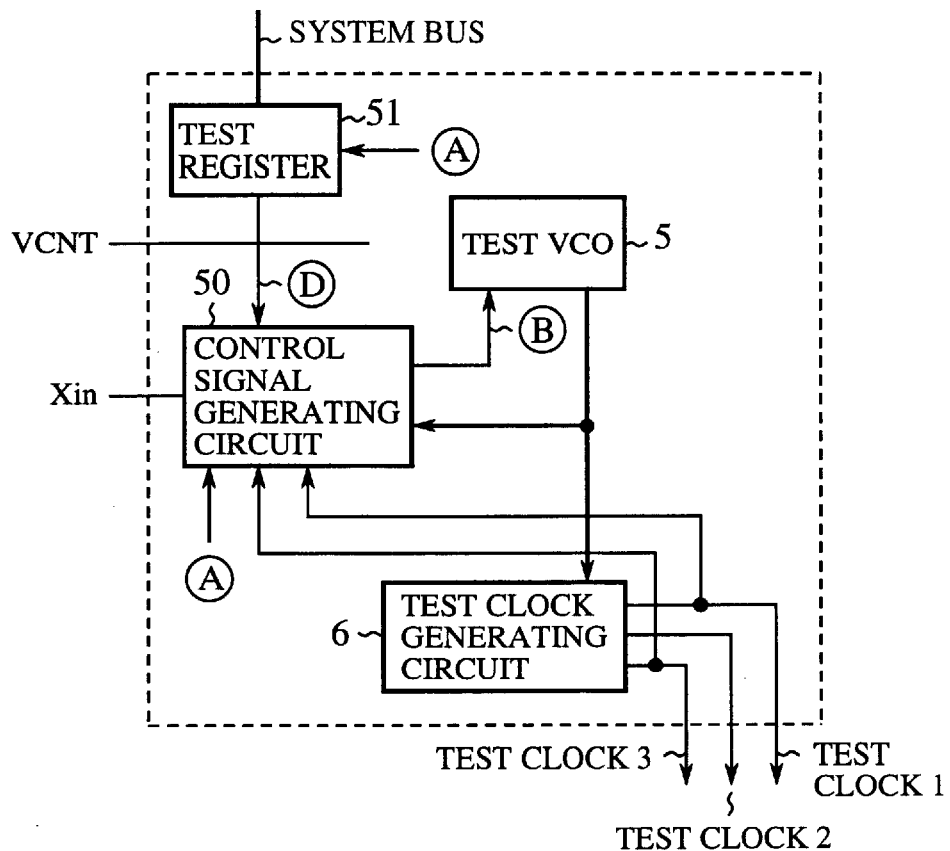
FIG. 15 is a schematic circuit diagram showing the structure of a characterized part of internal clock generating circuitry having a testing function according to a fourth embodiment of the present invention.
Figure 16:
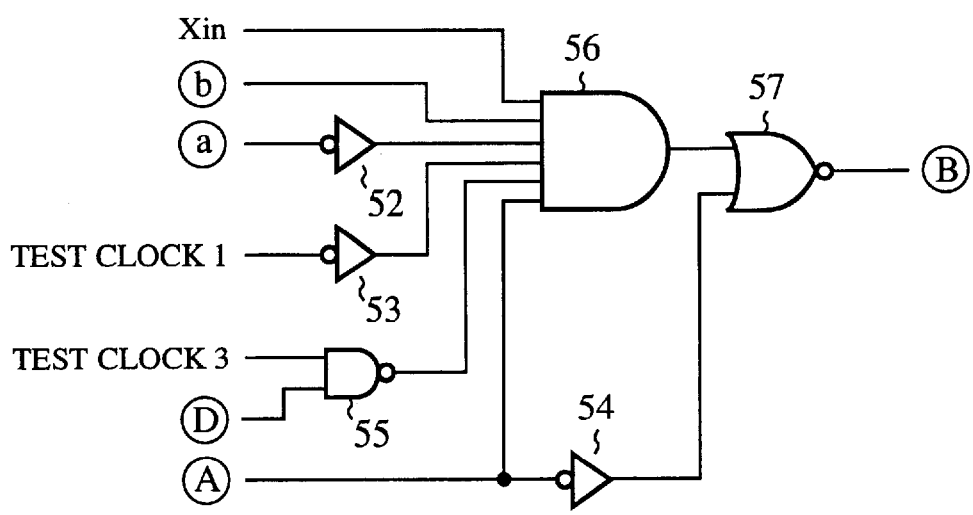
FIG. 16 is a schematic circuit diagram showing the gate-level structure of a control signal generating circuit included with the internal clock generating circuitry according to the fourth embodiment of the present invention.
Figure 17:
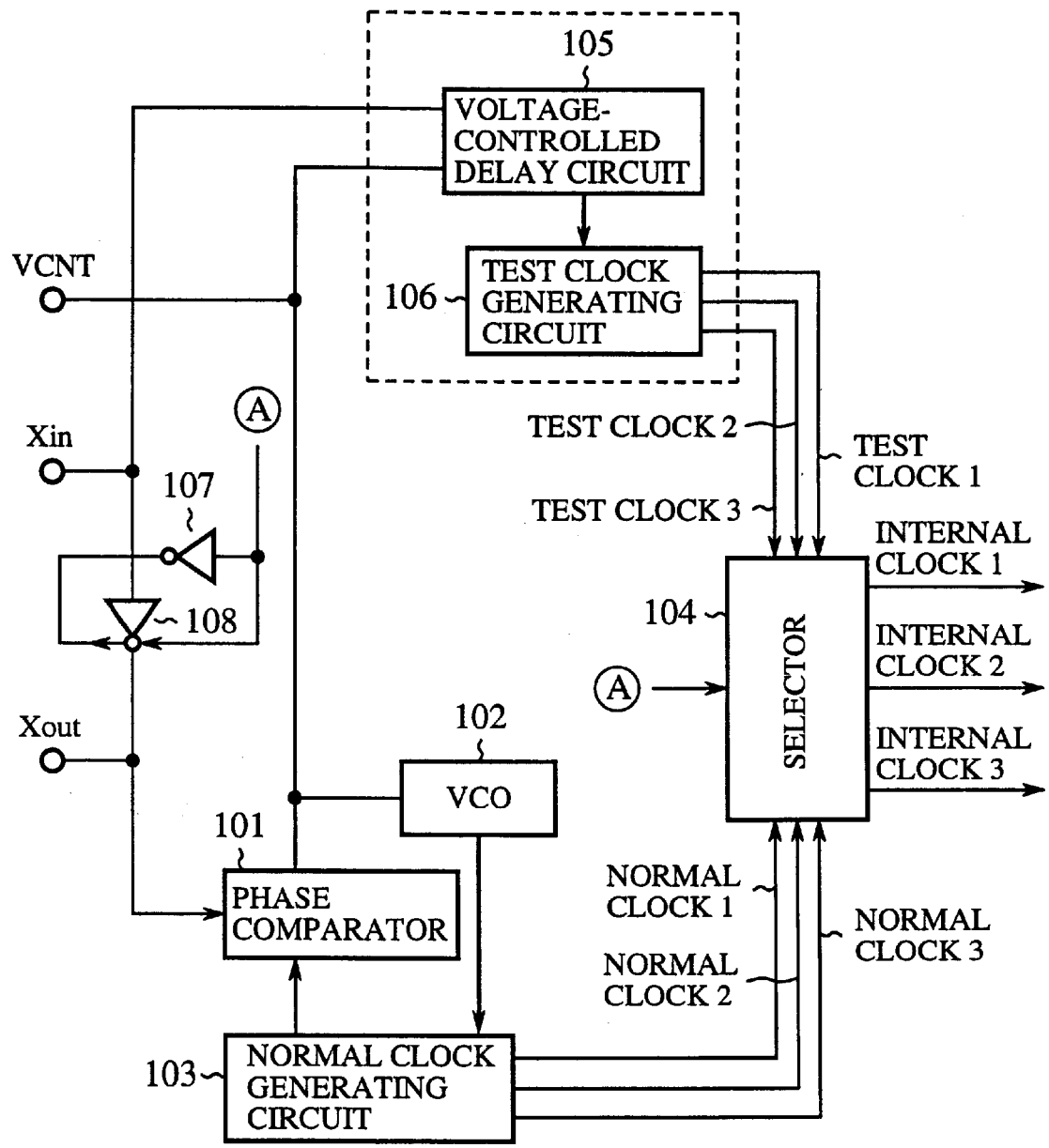
FIG. 17 is a schematic circuit diagram showing the structure of prior art internal clock generating circuitry having a testing function.

Referring next to FIG. 15, a schematic circuit diagram is illustrated showing the structure of a characterized part of internal clock generating circuitry having a testing function according to a fourth embodiment of the present invention. The characterized part as shown in FIG. 15 corresponds to the part of FIG. 1 surrounded by a dashed line. In FIG. 15, the same reference numerals as shown in FIG. 1 denote the same components as of the first embodiment or like components, and therefore the description of those components will be omitted hereinafter. Reference numeral 50 denotes a control signal generating circuit having a structure different from that of the control signal generating circuit 7 as shown in FIG. 1, for furnishing a control signal B to a test VCO 5, and numeral 51 denotes a test register for storing a one-bit value to select an operation mode for the control signal generating circuit 50. A plurality of test clock signals 1 and 3 and a control signal D having a value corresponding to the contents of the test register 51 are applied to the control signal generating circuit 50.

Referring next to FIG. 13, a schematic circuit diagram is illustrated showing the gate-level structure of the control signal generating circuit 50. In the figure, reference numerals 52, 53, and 54 denote inverters, numeral 55 denotes a NAND gate for enabling or disabling an AND gate 56 to receive the test clock signal 3 according to the control signal D, and numeral 57 denotes a NOR gate. The control signal generating circuit 50 has two operating modes according to the voltage level of the control signal D. In a first operating mode, that is, when the control signal D is at a Low level, the control signal B is at a Low level only if an input signal applied to an input terminal Xin is at a High level, an output signal a from the test VCO 5 is at a Low level, an output signal b from the test VCO 5 is at a High level, and the test clock signal 1 is at a Low level, provided that a control signal A is at a High level. Otherwise, the control signal B is at a High level. In other words, when the control signal D is at a Low level, the control signal generating circuit 50 operates in the same manner that the control signal generating circuit 30 according to the second embodiment, as shown in FIG. 9, does. In a second operating mode, that is, when the control signal D is at a High level, the control signal B is at a Low level only if the input signal applied to an input terminal Xin is at a High level, the output signal a from the test VCO 5 is at a Low level, the output signal b from the test VCO 5 is at a High level, and the test clock signals 1 and 3 are at a Low level, provided that a control signal A is at a High level. Otherwise, the control signal B is at a High level. In other words, when the control signal D is at a High level, the control signal generating circuit 50 operates in the same manner that the control signal generating circuit 40 according to the third embodiment, as shown in FIG. 12, does.

When the test register 51 furnishes the control signal D at a Low level, the control signal generating circuit 50 operates in the same manner that the control signal generating circuit 30 according to the second embodiment does, as previously mentioned. In other words, when the input signal applied to the input terminal Xin makes a Low to High transition and therefore the control signal B makes a High to Low transition, the test clock signals 1 and 2 are held at certain levels, respectively, while only the test clock signal 3 can be held at one of two possible levels, as shown in FIG. 11.

When the test register 51 furnishes the control signal D at a High level, the control signal generating circuit 50 operates in the same manner that the control signal generating circuit 40 according to the third embodiment does, as previously mentioned. In other words, when the input signal applied to the input terminal Xin makes a Low to High transition and therefore the control signal B makes a High to Low transition, all the test clock signals 1 to 2 are held at certain levels, respectively, as shown in FIG. 14.

As previously explained, the fourth embodiment offers the same advantage as provided by the aforementioned third embodiment. In addition, since the internal clock generating circuitry according to the fourth embodiment includes the control signal generating circuit 50 provided with the NAND gate 55 for enabling or disabling the ANG gate 56 to receive the test clock signal 3, the internal clock generating circuitry can generate the plurality of test clock signals whose levels can be held at certain levels in the second operating mode, including the test clock signal 3 that can be held at one of two possible levels when the test clock signal 3 is applied to the ANG gate 56 in the first operating mode. Accordingly, the fourth embodiment can offer the advantage of being able to increase a variety of tests to be conducted on an internal circuit and perform a finer stopping control operation on the internal circuit.

In addition, since the internal clock generating circuitry includes the test register 51 for generating the control signal D, it can determine the type of test to be conducted on the internal circuit by writing a predetermined one-bit value into the test register 51. Accordingly, the fourth embodiment offers the advantage of being able to enhance the usefulness of the function of testing the internal circuit.

In a variant of the fourth embodiment, instead of generating the control signal D by writing a proper one-bit value into the test register 51, the control signal D can be furnished to the control signal generating circuit 50 from outside the internal clock signal generating circuitry.

Many widely different embodiments of the present invention may be constructed without departing from the spirit and scope of the present invention. It should be understood that the present invention is not limited to the specific embodiments described in the specification, except as defined in the appended claims.

What is claimed is:

1. Internal clock generating circuitry comprising:
a phase comparator for comparing the phase of a clock signal applied thereto from outside the circuitry with that of a feedback signal fed back thereto, and for generating a voltage corresponding to the difference between the phases of those clock signals;
a voltage-controlled oscillator or VCO for generating a clock signal having a frequency corresponding to the voltage from said phase comparator;
a normal clock signal generating circuit for generating at least one normal clock signal used for making an internal circuit operate under normal conditions from the clock signal from said VCO, and for generating and feeding the feedback signal back to said phase comparator;
a test VCO for generating a clock signal having a frequency corresponding to the voltage from said phase comparator;
a test clock signal generating circuit for generating at least one test clock signal used for testing said internal circuit from the clock signal from said test VCO;
a selector for selecting either said normal clock signal generated by said normal clock signal generating circuit or said test clock signal generated by said test clock signal generating circuit, and for furnishing the selected clock signal to said internal circuit; and
a control signal generating circuit for generating a control signal to stop said test VCO according to an input signal applied thereto from outside the circuitry.

2. The internal clock generating circuitry according to claim 1, wherein said test VCO includes a plurality of inverters connected in a loop, one of which can hold an output level according to the control signal from said control signal generating circuit.

3. The internal clock generating circuitry according to claim 2, wherein said VCO includes a plurality of switching transistors each of which is connected between an output of a corresponding one of said plurality of inverters and a voltage source or ground, and wherein the control signal from said control signal generating circuit is applied to a control electrode of one switching transistor connected between the output of said one of said plurality of inverters that can hold an output level and said voltage source or ground, and a control electrode of each of other switching transistors connected between the output of each of other inverters and said voltage source or ground is connected to said voltage source or ground so that each of the other switching transistors is brought out of conduction.

4. The internal clock generating circuitry according to claim 1, wherein said control signal generating circuit receives one or more test clock signals so as to hold the levels of said one or more test clock signals, when testing said internal circuit.

5. The internal clock generating circuitry according to claim 4, wherein said control signal generating circuit includes a selecting means for enabling or disabling an input of at least one of said one or more test clock signals.

6. The internal clock generating circuitry according to claim 5, further comprising a register for generating and furnishing a control signal to said selecting means to cause said selecting means to enable or disable the input of at least one of said one or more test clock signals.

* * * * *